(12) United States Patent
Hasegawa et al.

(10) Patent No.: US 8,039,056 B2
(45) Date of Patent: Oct. 18, 2011

(54) POLYMER THIN FILM, PATTERNED SUBSTRATE, PATTERNED MEDIUM FOR MAGNETIC RECORDING, AND METHOD OF MANUFACTURING THESE ARTICLES

(75) Inventors: Hirokazu Hasegawa, Kyoto (JP); Mikihito Takenaka, Kyoto (JP); Feng Chen, Kyoto (JP); Hiroshi Yoshida, Ibaraki (JP)

(73) Assignee: Hitachi, Ltd., Tokyo (JP)

( * ) Notice: Subject to any disclaimer, the term of this patent is extended or adjusted under 35 U.S.C. 154(b) by 331 days.

(21) Appl. No.: 12/019,848

(22) Filed: Jan. 25, 2008

(65) Prior Publication Data

US 2008/0233435 A1    Sep. 25, 2008

(30) Foreign Application Priority Data

Mar. 20, 2007    (JP) ................................. 2007-072344

(51) Int. Cl.
  *G11B 5/73*    (2006.01)
  *B05D 3/02*    (2006.01)
  *B44C 1/22*    (2006.01)

(52) U.S. Cl. ..................... 427/264; 428/848.8; 428/339; 428/220; 428/847; 427/374.2; 427/388.2

(58) Field of Classification Search .................. 428/826, 428/215, 339, 374.1, 195.1, 220, 209, 847, 428/848.2, 839.6, 848.8; 427/385.5, 374.1, 427/248.1, 256, 271, 264, 265, 388.2, 374.2; 525/131; 438/780, 781; 216/55, 41, 56

See application file for complete search history.

(56) References Cited

U.S. PATENT DOCUMENTS

| | | | |
|---|---|---|---|
| 2002/0055239 A1* | 5/2002 | Tuominen et al. | 438/781 |
| 2002/0135880 A1* | 9/2002 | Fink et al. | 359/586 |
| 2003/0118800 A1* | 6/2003 | Thomas et al. | 428/215 |
| 2004/0143063 A1* | 7/2004 | Chen et al. | 525/131 |
| 2006/0231525 A1* | 10/2006 | Asakawa et al. | 216/56 |
| 2008/0290067 A1* | 11/2008 | Yoshida et al. | 427/374.1 |

OTHER PUBLICATIONS

Ryu et al; Science, vol. 308 pp. 236-239; Apr. 8, 2005.*
Park et al; Polymer, vol. 44, Apr. 2003 p. 6725-6760.*
Fasolka et al; Macromolecules, Jun. 29, 2000, p. 5702-5712.*

* cited by examiner

*Primary Examiner* — Kevin M. Bernatz
*Assistant Examiner* — Louis Falasco
(74) *Attorney, Agent, or Firm* — Antonelli, Terry, Stout & Kraus, LLP.

(57) ABSTRACT

A polymer thin film in which cylindrical phases are distributed in a continuous phase and are oriented in a pass-through-direction of the film includes at least: a first block copolymer including at least a block chain A1, as a component of the continuous phase, composed of polymerized monomers a1, and a block chain B1, as a component of the cylindrical phases, composed of polymerized monomers b1; and a second block copolymer including at least a block chain A2, as a component of the continuous phase, composed of polymerized monomers a2, and a block chain B2, as a component of the cylindrical phases, composed of polymerized monomers b2, with the second copolymer having a degree of polymerization different from that of the first copolymer. A film thickness of the polymer thin film and an average center distance between adjacent cylindrical phases have a relation represented by a predetermined expression.

9 Claims, 13 Drawing Sheets

FIG. 3A Example
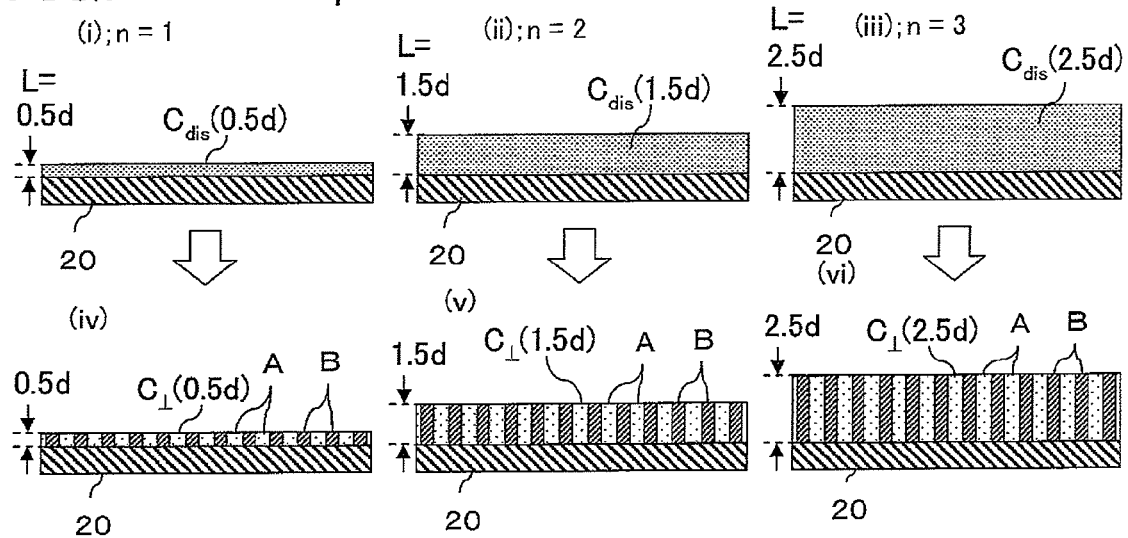
FIG. 3B Comparative Example
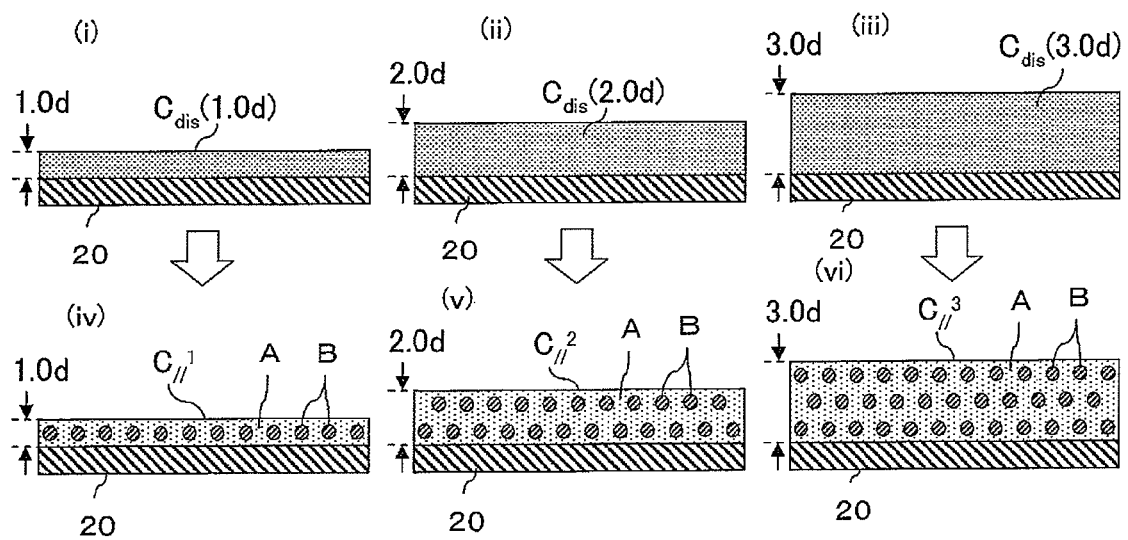
FIG. 3C Comparative Example
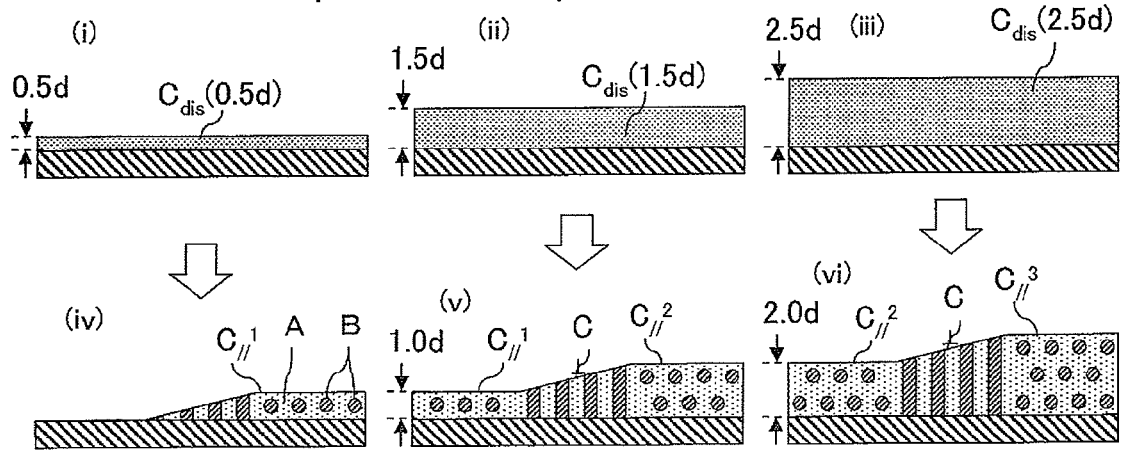

FIG. 7A

| Initial film thickness (nm) | OM observation | Film thickness after heat treatment (nm) | L / d | AFM observation |
|---|---|---|---|---|
| 18 | Uniform | 18 | 0.7 | $C_\perp$ |
| 29 | Uniform | 28 | 1.1 | $C_{//}^1$ |
| 39 | Uniform | 38 | 1.5 | $C_\perp$ |
| 52 | Uniform | 50 | 2.0 | $C_{//}^2$ |
| 62 | Uniform | 63 | 2.5 | $C_\perp$ |

OM ; Optical Microscope
AFM ; Atomic Force Microscope

FIG. 7B

| Initial film thickness (nm) | OM observation | Film thickness after heat treatment (nm) | L / d | AFM observation |
|---|---|---|---|---|
| 21 | Uniform | 21 | 0.7 | $C_\perp$ |
| 34 | Uniform | 33 | 1.1 | $C_{//}^1$ |
| 46 | Uniform | 43 | 1.5 | $C_\perp$ |
| 56 | Uniform | 57 | 1.9 | $C_{//}^2$ |
| 72 | Uniform | 71 | 2.4 | $C_\perp$ |

OM ; Optical Microscope
AFM ; Atomic Force Microscope

FIG. 7C

| Initial film thickness (nm) | OM observation | Film thickness after heat treatment (nm) | L / d | AFM observation |
|---|---|---|---|---|
| 25 | Uniform | 24 | 1.2 | $C_{//}^1$ |
| 30 | Microphase separation with thicker and thinner region | 22 | 1.1 | Both $C_{//}^2$, $C_{//}^1$ and $C_{//}^2$, $C\perp$ at interface |
| | | 40 | 2.0 | |
| 41 | Uniform | 41 | 2.1 | $C_{//}^2$ |

OM ; Optical Microscope
AFM ; Atomic Force Microscope

FIG. 10A

| Weight fraction of first PS-b-PMMA (wt%) | PS block chain molecular weight ratio | φ PMMA | d (nm) | L (nm) | L/d | Observation |
|---|---|---|---|---|---|---|
| 60 | 1.3 | 0.28 | 28 | 42 | 1.5 | Both perpendicular and parallel orientations |
| 70 | 1.3 | 0.28 | 26 | 42 | 1.6 | Allover perpendicular orientation |
| 80 | 1.3 | 0.27 | 25 | 35 | 1.4 | Allover perpendicular orientation |
| 90 | 1.3 | 0.26 | 22 | 33 | 1.5 | Allover perpendicular orientation |
| 95 | 1.3 | 0.26 | 21 | 30 | 1.4 | Both perpendicular and parallel orientations |

FIG. 10B

| Weight fraction of first PS-b-PMMA (wt%) | PS block chain molecular weight ratio | φ PMMA | d (nm) | L (nm) | L/d | Observation |
|---|---|---|---|---|---|---|
| 90 | 7.3 | 0.23 | — | 53 | — | Macroscopic separation |
| 80 | 4.5 | 0.27 | 34 | 55 | 1.6 | Allover perpendicular orientation |
| 90 | 1.5 | 0.30 | 25 | 41 | 1.6 | Allover perpendicular orientation |
| 90 | 1.3 | 0.26 | 26 | 37 | 1.4 | Allover perpendicular orientation |
| 90 | 0.4 | 0.27 | 19 | 33 | 1.7 | Both perpendicular and parallel orientations |

POLYMER THIN FILM, PATTERNED SUBSTRATE, PATTERNED MEDIUM FOR MAGNETIC RECORDING, AND METHOD OF MANUFACTURING THESE ARTICLES

CROSS REFERENCE TO RELATED APPLICATIONS

This application claims the benefit of Japanese Patent Application No. 2007-072344 filed on Mar. 20, 2007, the disclosure of which is incorporated herein by reference.

BACKGROUND OF THE INVENTION

1. Field of the Invention

The present invention relates to a polymer thin film having a microphase-separated structure in which cylindrical phases (a cylindrical microdomain) distributed in a continuous phase are oriented in a pass-through direction of the polymer thin film and provided in a substantially periodic array pattern, and a method of manufacturing the same. The present invention also relates to a patterned substrate having on its surface the periodic array pattern of the microphase-separated structure, and a method of manufacturing the same. The present invention also relates to a patterned medium for magnetic recording manufactured by using the patterned substrate, and a method of manufacturing the same.

2. Description of the Related Art

An electronic device, an energy storage device, and a sensor, or the like have been increasingly reduced in size and have achieved higher performance these years. This requires that a minute periodic array pattern in several nanometers to several hundred nanometers scales be created on a substrate. There is a need for establishing a process of manufacturing a minute pattern with high precision and at low cost. A top-down technique such as lithography is generally used for creating such a minute pattern by minutely cutting a bulk material. For example, photo lithography is typically used in processing a semiconductor such as a LSI.

As a pattern becomes minuter, the top-down technique has more difficulty in terms of an equipment and a process for manufacturing a minute pattern. In particular, if a minute pattern is processed in a several tens nanometers scale or less, the pattern has to be processed using an electron beam or deep ultraviolet rays, which requires an equipment with a large amount of investment. Further, if a pattern is too minute to make it impossible to be created using a mask, a direct writing technique has to be used, which significantly reduces a process throughput.

Under such circumstances, a process applying a self-assembly phenomenon, in which a material organizes a structure by itself, receives much attention. In particular, a process applying the self-assembly phenomenon, a so-called microphase separation, of a block copolymer is excellent in being capable of creating a minute periodic structure having various shapes in tens to hundreds of nanometers scales.

If different polymer block chains constituting a block copolymer are not mixed with each other (incompatible), a specific minute structure having a periodic array pattern is self-assembled thanks to a microphase separation of the polymer block chains.

Techniques of creating a minute periodic pattern using the self-assembly phenomenon have been known, in which, for example, a substrate is etched using a block copolymer composed of a combination such as polystyrene and polybutadiene, polystyrene and polyisoprene, polystyrene and polymethylmethacrylate, as a mask, to thereby create a structure such as a hole, a line and space pattern, or the like (see, for example, "Block Copolymer Lithography Periodic Arrays of ~$10^{11}$ Holes in 1 Square Centimeter", M. Park, C. Harrison, P. M. Chaikin, R. A. Register, D. H. Adamson, Science, Vol. 276 (1997) pp. 1401-1404, and "Enabling nanotechnology with self assembled block copolymer patterns", C. Park, J. Yoon, E. L. Thomas, Polymer, Vol. 44 (2003) pp. 6725-6760).

The microphase separation phenomenon of block copolymers enables to obtain a polymer thin film having a structure in which a spherical or cylindrical microdomain is periodically arrayed in a continuous phase.

If the obtained microphase-separated structure is used as a patterned substrate such as an etching mask, it is desirable that cylindrical phases are provided in a period array pattern and are oriented perpendicular to a substrate (in a pass-through direction of the polymer thin film) in a continuous phase.

This is because the structure in which the cylindrical phases are oriented perpendicular to the substrate has a flexibility in changing its aspect ratio, compared to a structure in which a spherical microdomain are provided in a periodic array pattern on a surface of a substrate. The aspect ratio of a domain is a ratio of a size of a domain in perpendicular direction to a substrate, to a size of a domain in parallel to the substrate.

If the microphase-separated structure having the spherical microdomain is used as a patterned substrate for use in an etching mask or the like, its maximum aspect ratio is 1, which is smaller than that of the structure having the cylindrical phases. That is, the structure with the spherical microdomain has smaller control flexibility than that with the cylindrical phases.

Nevertheless, the structure with the cylindrical phases composed of the block copolymers caused by the microphase separation are often oriented parallel to the substrate.

Conventional techniques for orienting the cylindrical phases perpendicular to a substrate (in the pass-through direction of the polymer thin film) are as follows.

A first conventional technique to obtain a microstructure oriented perpendicular to a substrate is that an extremely high electric field is applied to a film composed of block copolymers in a pass-through direction thereof, to thereby orient cylindrical phases thereof in a direction of the electric field (see, for example, "Effect of an Electric Field on Block Copolymer Microstructure", K. Amundson, E. Helfand, D. D. Davis, X. Quan, S. S. Patel, S. D. Smith, Macromolecules, Vol. 24 (1991), pp. 6546-6548).

A second technique is that a surface of a substrate is chemically modified, and is treated to have an equal affinity for each block chain of block copolymers. (see, for example, "Neutrality Conditions for Block Copolymer Systems on Random Copolymer Brush Surfaces", E. Huang, S. Pruzinsky, T. P. Russell, Macromolecules, Vol. 32 (1999), pp. 5299-5303).

A third technique is that a thin film made of a block copolymer composed of three different block chains is formed while inducing a gradual change in a thickness of the film. It has been reported that a microstructure having cylindrical phases oriented perpendicular to a surface of the film are sometimes be created in a region in the film having a specific thicknesses (see, for example, "Phase Behavior in Thin Films of Cylinder-Forming Block Copolymers", A. Knoll, A. Horvat, K. S. Lyakhova, G. Krausch, G. J. A. Sevink, A. V. Zvelindovsky, and R. Magerle, Physical Review Letters, Vol. 89 (2002), No. 3, pp. 035501-1 to 035501-4).

A fourth technique is that, in a technological field of a separation film (a permselective film), a block copolymer composed of polymer chains, which are incompatible with each other, is microphase-separated, and resultant cylindrical phases are selectively removed to obtain a porous film having micropores (see, for example, Japanese Laid-Open Patent Application, Publication No. HEI 5-287084, paragraph 32).

However, the first conventional technique has a problem that, in order to apply the extremely high electric field to the film composed of block copolymers, voltage has to be applied to an extremely narrow gap between a surface of the film and an electrode which are closely contacted with each other.

The second conventional technique has a problem that it is not generally easy to treat the surface of the substrate such that the surface has an equal affinity for each block chain of the block copolymers.

The third conventional technique has a problem that the film is required to have a gradual change in its thickness, which makes it impossible to obtain a substrate having a structure in which the cylindrical phases are uniformly provided over and perpendicular to the substrate.

The conventional techniques above are thus not suitable for providing a structure in which the cylindrical phases are oriented perpendicular to a substrate.

That is, those techniques making use of a microphase separation of block copolymers are still convenient and low in cost to obtain a minute periodic structure in a several tens to several hundreds of nanometers scale. However, the techniques have a difficulty in obtaining the structure having the cylindrical phases perpendicular to a substrate.

The fourth conventional technique has a problem that a periodic array pattern of the cylindrical phases distributed in the continuous phase can be obtained only in a limited portion of the polymer thin film.

The present invention has been made in an attempt to solve the problems described above, and provides a polymer thin film in which the cylindrical phases are extensively provided in a periodic array pattern and in the pass-through direction of the polymer thin film, making use of a microphase separation of the block copolymers. The present invention also provides a method of manufacturing a patterned substrate having on its surface the periodic array pattern of the microphase-separated structure. The present invention also provides a method of mass-producing a patterned medium for magnetic recording capable of, for example, increasing a recording density, by transferring a pattern of the patterned substrate onto the patterned medium.

SUMMARY OF THE INVENTION

In an aspect of the present invention, there is provided a polymer thin film in which cylindrical phases are distributed in a continuous phase. The cylindrical phases are provided in a substantially periodic array pattern and are oriented in a pass-through-direction of the polymer thin film. The polymer thin film includes at least a first block copolymer and a second block copolymer. The first block copolymer includes at least: a block chain A1, as a component of the continuous phase, composed of polymerized monomers a1; and a block chain B1, as a component of the cylindrical phases, composed of polymerized monomers b1. The second block copolymer includes at least: a block chain A2, as a component of the continuous phase, composed of polymerized monomers a2; and a block chain B2, as a component of the cylindrical phases, composed of polymerized monomers b2. The second block copolymer has a degree of polymerization different from that of the first block copolymer. A film thickness L of the polymer thin film and an average center distance r between adjacent cylindrical phases have a relation represented by an expression as follows:

$$\frac{\sqrt{3}}{2}r \times \left\{\frac{1}{2}(2n-1) - 0.35\right\} \le L \le \frac{\sqrt{3}}{2}r \times \left\{\frac{1}{2}(2n-1) + 0.35\right\} (n = 1,2,3)$$

With a configuration as described above, the cylindrical phases are oriented in the pass-through direction of the polymer thin film, which otherwise tend to be oriented parallel therein. The perpendicular orientation of the cylindrical phases is obtained due to an effect of mixing high molecular weight polymers and of packing the cylindrical phases in the polymer thin film.

Other features and advantages of the present invention will become more apparent from the following detailed description of the invention, when taken in conjunction with the accompanying exemplary drawings.

BRIEF DESCRIPTION OF THE DRAWINGS

FIG. 3A (i) to FIG. 3A (vi) are views showing a polymer thin film according to an example in which cylindrical phases are oriented perpendicular to a substrate, after the polymer thin film is subjected to heat treatment to cause a microphase separation. FIG. 3B (i) to FIG. 3B (vi) are views showing a polymer thin film according to a comparative example in which cylindrical phases are oriented parallel to a substrate, after the polymer thin film is subjected to heat treatment to cause a microphase separation. FIG. 3C (i) to FIG. 3C (vi) are views showing a polymer thin film according to another comparative example in which cylindrical phases are oriented partly perpendicular to and partly parallel to a substrate, after the polymer thin film is subjected to heat treatment to cause a microphase separation.

FIG. 7A is a table showing observation results of a microphase-separated structure according to different film thicknesses of the coating $C_{dis}$, when a mixed system composed of two types of block copolymers is used such that PS and PMMA compose the continuous phase and the cylindrical phases, respectively, in a first example. FIG. 7B is a table showing observation results of a microphase-separated structure according to different film thicknesses of the coating $C_{dis}$, when a mixed system of block copolymers having different composition from that of FIG. 7A, such that the PMMA and PS compose the continuous phase A and the cylindrical phases B, and the cylindrical phases B are oriented perpendicular to a surface of the coating $C_{dis}$ in the continuous phase A, in the first example. FIG. 7C is a table showing observation results of a microphase-separated structure according to different film thicknesses of the coating $C_{dis}$ composed of a single block copolymer, in a comparative example.

FIG. 10A is a table showing observation results of an orientation of the cylindrical phases when n=2 in Expression 1, and when weight fractions of a first block copolymer and a second block copolymer are varied. FIG. 10B is a table showing observation results of an orientation of the cylindrical phases when n=2 in Expression 1, and when molecular weight ratios of a block chain A1 to a block chain A2 are varied.

DETAILED DESCRIPTION OF THE EXEMPLARY EMBODIMENT

Polymer Thin Film

An embodiment of the present invention is described below in detail with reference to related drawings according to the necessity.

Figure 1A:
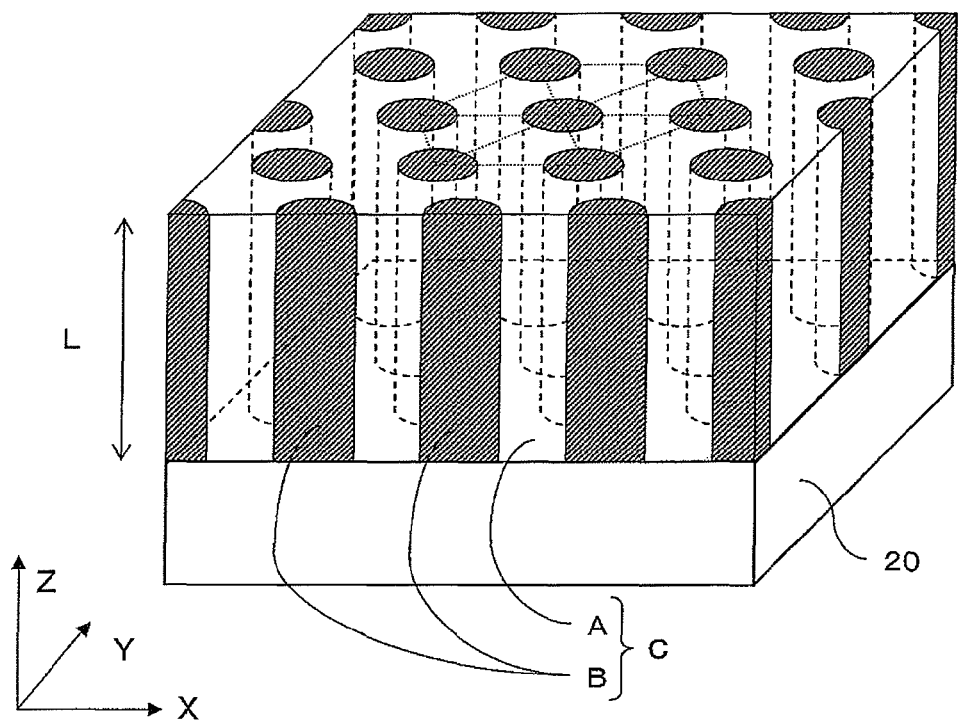
FIG. 1A and FIG. 1B are a perspective sectional view and a top view, respectively, showing a polymer thin film according to an embodiment of the present invention.

As shown in FIG. 1A, a polymer thin film C according to the embodiment has a microphase-separated structure including a continuous phase A and a cylindrical microdomain (hereinafter referred to as cylindrical phases B). The polymer thin film C is disposed on a surface of a substrate 20.

Figure 1B:
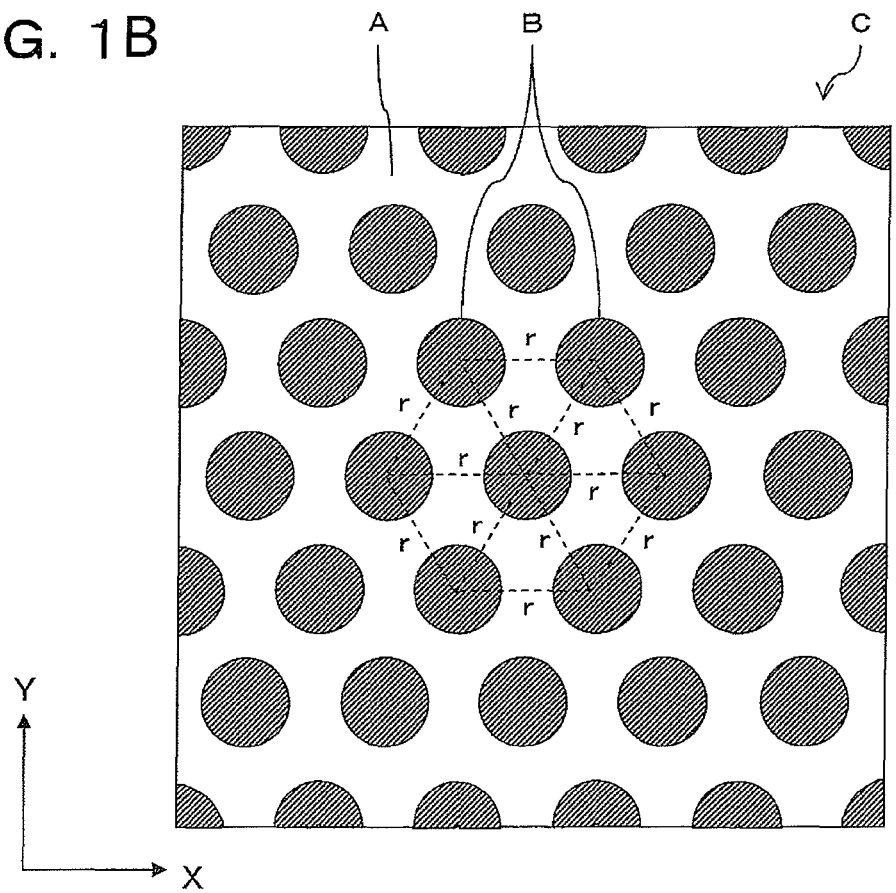

The cylindrical phases B are distributed in the continuous phase A, and are oriented in Z-axis direction as shown in FIG. 1A, that is, in a direction perpendicular to the substrate 20 (in a pass-through direction of the polymer thin film C). As shown in FIG. 1B, the cylindrical phases B are formed of a periodic array pattern to create a hexagonal close-packed structure with respect to a horizontal plane of the polymer thin film C (an X-Y plane in FIG. 1A). The periodic array pattern in the cylindrical phases B is not limited to the hexagonal close-packed structure. The periodic array pattern may be a cubic packed structure or a structure having a poor array regularity.

A relation between a film thickness L of the polymer thin film C and an average center distance "r" of a pair of adjacent cylindrical phases B is represented by Expression 1 wherein n=1, 2 and 3:

$$\frac{\sqrt{3}}{2} r \times \left\{ \frac{1}{2}(2n-1) - 0.35 \right\} \leq \qquad (1)$$
$$L \leq \frac{\sqrt{3}}{2} r \times \left\{ \frac{1}{2}(2n-1) + 0.35 \right\} (n = 1,2,3)$$

If the thickness L of the polymer thin film C is not within a range defined by Expression 1, the polymer thin film C may not have the perpendicularly oriented cylindrical phases B (see Comparative Example in FIG. 3B, $C_{//}^1$ in FIG. 7A, and $C_{//}^2$ in FIG. 7B).

Figure 2A:
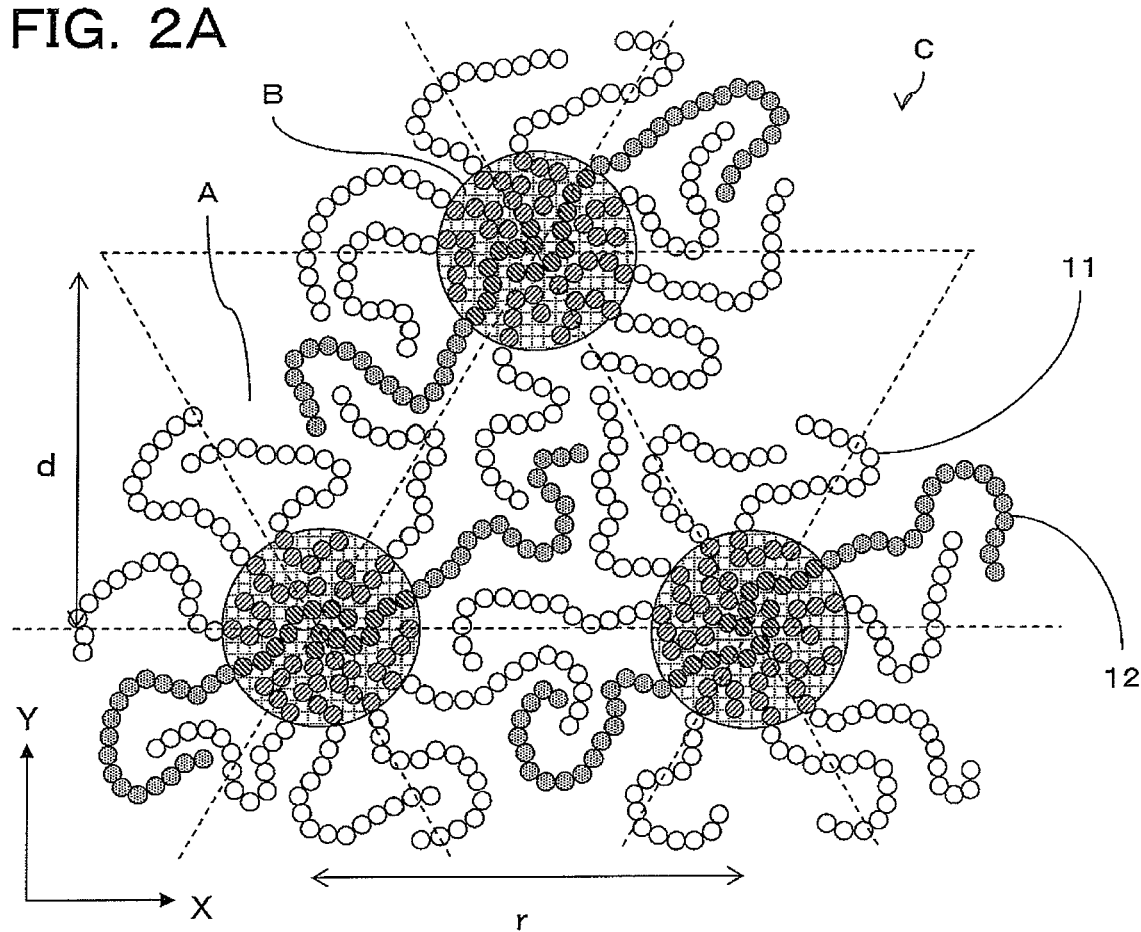
FIG. 2A is a schematic view partially enlarging FIG. 1B and showing the polymer thin film on a molecular level.

As shown in FIG. 2A, the polymer thin film C is composed of a first block copolymer 11 and a second block copolymer 12.

Figure 2B:
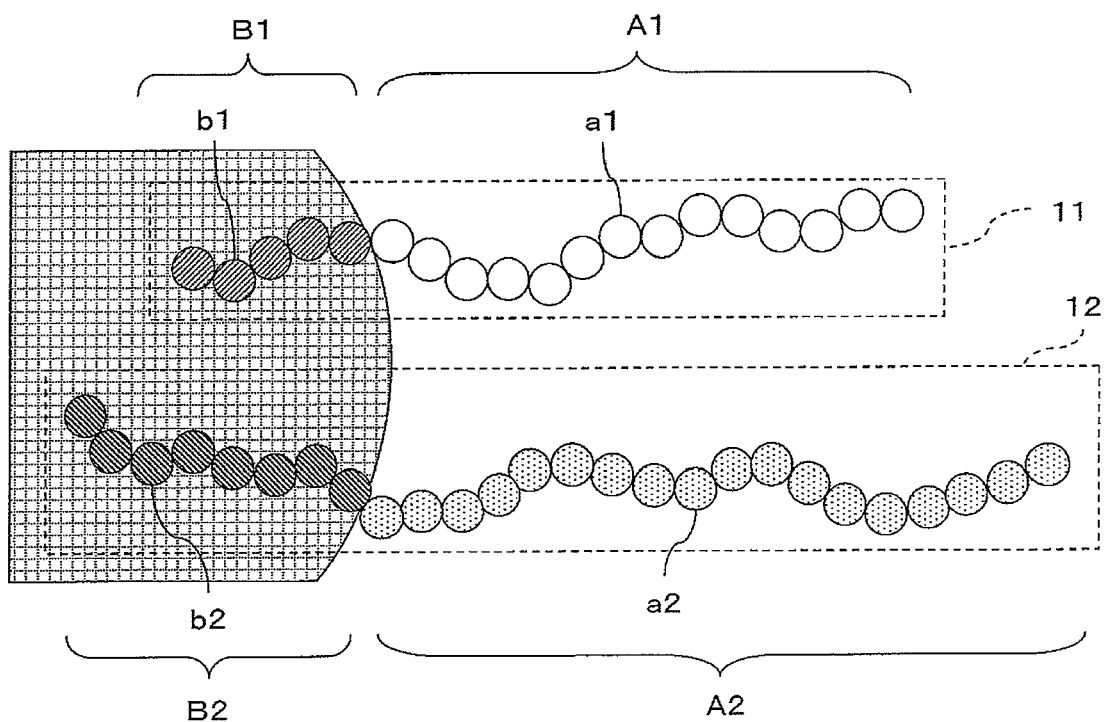
FIG. 2B is a conceptual diagram illustrating first and second block copolymers according to the embodiment.

As shown in FIG. 2B, the first block copolymer 11 is composed of a block chain A1 and a block chain B1, which are in turn composed of polymerized monomers a1 and polymerized monomers b1, respectively. The second block copolymer 12 is composed of a block chain A2 and a block chain B2, which are in turn composed of monomers a2 and monomers b2, respectively.

The monomer a1 is a component of the continuous phase A, and has a higher affinity for the monomer a2 than for the monomer b1 and the monomer b2.

The monomer b1 is a component of the cylindrical phases B, and has a higher affinity for the monomer b2 than for the monomer a1 and the monomer a2.

The monomer a2 is a component of the continuous phase A, and has a higher affinity for the monomer a1 than for the monomer b1 and the monomer b2.

The monomer b2 is a component of the cylindrical phases B, and has a higher affinity for the monomer b1 than for the monomer a1 and the monomer a2.

Hence, the block chain A1 and the block chain A2 are compatible with each other, and the block chain B1 and the block chain B2 are compatible with each other.

The block chain A1 and the block chain A2 may have same chemical compositions. The block chain B1 and the block chain B2 may have same chemical compositions. The polymer thin film C may contain a component other than the block copolymers 11,12, for example, a monomer thereof or other organic or inorganic component.

Next are described molecular weights and amounts to be mixed of the first and second block copolymers 11, 12, assuming that the first block copolymer 11 is a primary component, and the second block copolymer 12 is a secondary component.

To obtain a microphase-separated structure in which the cylindrical phases B composed of the block chain B1 and the block chain B2 are distributed in the continuous phase A composed of the block chain A1 and the block chain A2, the molecular weights and the amounts of the first and second block copolymers 11,12 may be suitably adjusted as follows. That is, a volume fraction of a phase composed of the block chain B1 and the block chain B2 is not less than 0.20 and not more than 0.35 of a total volume of the polymer thin film C.

To obtain a structure in which the cylindrical phases B are oriented perpendicular to the substrate 20, the weight fractions of the first and second block copolymers 11,12 are adjusted as follows. That is, the weight fraction of the first block copolymer 11 is not less than 65% and not more than 95% of a total weight of the first and second block copolymers 11,12.

A degree of polymerization of the first block copolymer 11 is preferably different from that of the second block copolymer 12.

That is, the molecular weights of the first and second block copolymers 11,12 may be adjusted so that a ratio of the molecular weight of the block chain A1 to that of the block chain A2 is more than 1.0 and not more than 5.0. The molecular weights of the block chain B1 and the block chain B2 are not specifically limited.

Energy in the mixed system in which a mixture of the block copolymers 11,12 forms the cylindrical phases B is stabilized, if the degree of polymerization of the first and second block copolymers 11,12 is suitably adjusted. This makes it possible to obtain a periodic array pattern of the microphase-separated structure over a wide region in the polymer thin film C.

If the weight fractions of the first and second block copolymers 11,12, and the ratio of the molecular weight of the block chain A1 to the block chain A2 are not within a range described above, the polymer thin film C may not have a periodic array pattern over its wide area, or the cylindrical phases B may not be oriented perpendicular to the substrate 20 (see Comparative Example in FIG. 3C, FIG. 10A and FIG. 10B).

It is to be noted that the range described above is only an example, and the present invention is not limited to this.

A block copolymer used in the present invention may be synthesized using any appropriate technique. However, to obtain a further periodic microphase-separated structure, a synthesis technique in which a block copolymer has a smallest possible molecular weight distribution may be suitably used, for example, a living polymerization method.

Next is specifically described a polymer which may be used as a block copolymer in the present invention. If a polystyrene is used as the block chain A1, a polystyrene may be used as the block chain A2. In this case, a polyphenylene ether, a polymethylvinyl ether, a poly(α-methyl styrene), a nitrocellulose, or the like may also be used as the block chain A2, all of which are polymers compatible with the polystyrene as the block chain A1.

If an polymethylmethacrylate is used as the block chain A1, a polymethylmethacrylate may be used as the block chain A2. In this case, a styrene-acrylonitrile copolymer, an acrylonitrile-butadiene copolymer, a vinylidene fluoride trifluoroethylene copolymer, a vinylidene fluoride tetrafluoroethylene copolymer, a vinylidene fluoride hexafluoroacetone copolymer, a vinylphenol-styrene copolymer, a vinylidene chloride-acrylonitrile copolymer, a vinylidene fluoride homopolymer, or the like may also be used as the block chain A2, all of which are polymers compatible with the polymethylmethacrylate as the block chain A1.

Similarly, a combination of the polymers described above for the block chain A1 and the block chain A2 may be applied to that for the block chain B1 and the block chain B2. It is to be noted that some of the polymers described above may be incompatible according to its molecular weight or density, or, if the polymer is a copolymer, its composition. Further, some of the polymers may become incompatible according to its temperature. Therefore, the polymer used is preferably compatible at a temperature of heat treatment to cause a microphase separation.

The first and second block copolymers 11,12 described above are, by way of example, AB diblock copolymers, in each of which two types of block chains, A and B, are bonded to each other at respective ends.

However, the block copolymers used in the embodiment may be any of the following copolymers: an ABA triblock copolymer; an ABC block copolymer composed of three or more types of polymer block chains; and a star block copolymer, in which all block chains thereof are bonded to each other at one point. Note that the block chains of the former two copolymers are arranged in line.

The block copolymer may be a polybutadiene polydimethylsiloxane, a polybutadiene-4-vinylpyridine, polybutadiene methyl methacrylate, a polybutadiene a poly-t-butyl methacrylate, a polybutadiene-t-butyl acrylate, a poly-t-butyl methacrylate poly-4-vinylpyridine, a polyethylene-polymethylmethacrylate, a poly-t-butyl methacrylatepoly-2-vinylpyridine, a polyethylene-poly-2-vinylpyridine, a polyethylene-poly-4-vinylpyridine, a polyisoprenepoly-2-vinylpyridine, a polymethylmethacrylatepolystyrene, a poly-t-butyl methacrylatepolystyrene, a polymethyl acrylate polystyrene, polybutadienepolystyrene, a polyisoprenepoly-styrene, a polystyrenepoly-2-vinylpyridine, a polystyrenepoly-4-vinylpyridine, a polystyrenepolydimethylsiloxane, a polystyrene poly-N, N-dimethylacrylamide, a polybutadiene-sodium polyacrylate, a polybutadienepolyethylene-oxide, a poly-t-butyl methacrylatepolyethylene-oxide, a polystyrene polyacrylic acid, a polystyrene polymethacrylic acid, or the like.

Any material of the substrate 20 may be selected according to an intended purpose. The substrate 20 made of Si wafer or quartz may be suitable. The substrate 20 made of glass, ITO, resin may also be used. A thin film or a monomolecular film made of an inorganic substance, a metal, an oxide thereof, and an organic substance may be formed on the surface of the substrate 20.

Next is described a method of manufacturing the polymer thin film C with reference to FIG. 3A.

A mixed system composed of the first and second block copolymers 11,12 is dissolved in a solvent to prepare a polymer mixture solution. The solution is applied to a surface of the substrate 20 using a spin coat method, a dip coat method, a solution casting method, or the like (a solution applying step). The solvent used may be a good solvent for both the first second block copolymers 11,12 in the polymer mixture. Then, the solvent is evaporated from the polymer mixture solution, to thereby form a coating $C_{dis}$ (a coating forming step).

As shown in FIG. 3A (i), (ii), (iii), it is necessary to adjust a concentration of the polymer mixture, a rotation speed and time in the spin coat method, and a speed of withdrawing the substrate 20 from the polymer mixture solution in dip coating method, such that a film thickness L of the coating $C_{dis}$ satisfies Expression 1.

As shown in FIG. 3A (iv), (v), (vi), the coating $C_{dis}$ formed on the substrate 20 is heat treated to cause a microphase separation (a microphase separation step). In other words, the coating $C_{dis}$ at stages shown in FIG. 3 (i), (ii), (iii) has a nonequilibrium structure with a low regularity. After the heat treatment to cause the microphase separation, the nonequilibrium structure is translated into an equilibrium structure with a higher regularity. The heat treatment may be conducted in vacuum or under nitrogen or argon atmosphere at or higher than a glass transition temperature of the polymer mixture. The microphase separation may be caused using any other technique than the heat treatment. For example, the coating $C_{dis}$ may be left in a solvent atmosphere, or the like.

A cross sectional area and an average center distance r of the cylindrical phases B, which constitute the periodic array pattern, may vary and be changed according to the molecular weight and composition of the first block copolymer 11, the molecular weight of the second block copolymer 12, and the volume fractions of the block copolymers 11,12.

Next is described a principle of the microphase separation in the present invention with reference to FIG. 3A to FIG. 3C.

FIG. 3A (i) to FIG. 3A (vi) are views explaining an example in which the cylindrical phases B are oriented perpendicular to the substrate 20. FIG. 3B (i) to FIG. 3B (vi) are views explaining a comparative example in which the cylindrical phases B are oriented parallel to the substrate 20. FIG. 3C (i) to FIG. 3C (vi) are views explaining another comparative example in which the cylindrical phases B are oriented partly parallel to and partly perpendicular to the substrate 20.

Signs $C//^1$, $C//^2$ and $C//^3$ in FIG. 3 indicate that the cylindrical phases B in the polymer thin film C are all oriented parallel to the substrate 20, and that total numbers of layers of the cylindrical phases B are 1, 2 and 3, respectively.

A layer spacing of one layer is equivalent to a lattice spacing "d" of the cylindrical phases B provided in a periodic array pattern having a hexagonal lattice structure as shown in FIG. 2A. The lattice spacing d and the average center distance r of the hexagonal close-packed structured cylindrical phases B have a relation represented by Expression 2:

$$d = \frac{\sqrt{3}}{2} r \qquad (2)$$

Expression 2 is herein substituted for Expression 1, which is thus represented by Expression 3:

$$\frac{1}{2}(2n-1) - 0.35 \le \frac{L}{d} \le \frac{1}{2}(2n-1) + 0.35 \quad (n = 1,2,3) \qquad (3)$$

It is seen from Expression 3 that the thickness L of the polymer thin film C varies within a range around 0.5 d, 1.5 d, and 2.5 d, if n=1, 2, and 3, respectively.

Note that a coefficient of 0.35 in Expression 3 is an experimentally derived value.

A sign $C_\perp$ in FIG. 3A to FIG. 3C indicates that the polymer thin film C has the cylindrical phases B perpendicular to the substrate 20. A sign $C_{dis}$ in FIG. 3A to FIG. 3C indicates that the polymer thin film C does not have any microphase-separated structure but is in a disordered state, or has a microphase-separated structure without having the cylindrical phases B.

The lattice spacing d of the cylindrical phases B is typically determined by the molecular weights or compositions of the block copolymers. This means that the lattice spacing d is typically independent of whether the cylindrical phases B are oriented perpendicular to or parallel to the substrate 20.

Therefore, as shown in FIG. 3B(iv), the film thickness L is d, if the cylindrical phases B have a $C_{//}^1$ structure, in which one layer of the cylindrical phases B is oriented parallel to the substrate 20. As shown in FIG. 3B(v), the thickness L is 2 d, if the cylindrical phases B has a $C_{//}^2$ structure, in which two layers of the cylindrical phases B are oriented to parallel thereto. As shown in FIG. 3B(vi), the film thickness L is 3 d, if the cylindrical phases B have a $C_{//}^3$ structure, in which three layers of the cylindrical phases B are oriented parallel thereto.

If the film thickness L of the coating $C_{dis}$ has a value of an integral multiple of the lattice spacing d as described above, an interaction between the film thickness L and a surface of the substrate 20 tends to orient the cylindrical phases B parallel to the substrate 20. In other words, the cylindrical phases B does not tend to be oriented perpendicular to the substrate 20 on this condition.

On the other hand, as shown in FIG. 3A, if the thickness of the coating $C_{dis}$ is not an integral multiple of the lattice spacing d, the cylindrical phases B are expected to be oriented perpendicular to the substrate 20, while keeping the thickness of the coating $C_{dis}$ unchanged.

However, if the coating $C_{dis}$ composed of a single block copolymer is used as in a conventional technique, as shown in FIG. 3C, the cylindrical phases B are not uniformly but macroscopically oriented perpendicular to the substrate 20 in some regions having different film thicknesses.

A structure shown in FIG. 3C is described referring to FIG. 3C (ii) and (v), for example. In FIG. 3C(ii), a microphase separation is subjected to the coating $C_{dis}$. Then, as shown in FIG. 3C(v), the film thickness L (=1.5 d) is translated into an integral multiple of the lattice spacing d (1.0 d or 2.0 d), to thereby produce a macroscopic region having the structures $C_{//}^1$ and $C_{//}^2$, which are energetically stable. At the same time, the structure $C_\perp$ is also produced at a sloping boundary area between the structures $C_{//}^1$ and $C_{//}^2$.

In a case where a single block copolymer is used as the coating $C_{dis}$, less energy is necessary for forming a film having different thicknesses and the structures $C_{//}^1$ and $C_{//}^2$ in coexistence than a film having a uniform thickness and only existence of the structure $C_\perp$.

In other words, if a single block copolymer is used as the coating $C_{dis}$, regardless of the film thickness L of the coating $C_{dis}$, it is difficult to obtain a substrate having a surface over which is uniformly created the cylindrical phases B provided in a periodic array pattern and oriented perpendicular to the surface of the substrate.

The inventors made intensive efforts for overcoming such difficulty, and finally found that it is possible to obtain a substrate having a surface over which is uniformly created the cylindrical phases B in a periodic array pattern oriented perpendicular to the substrate. This is achieved by using and controlling the film thickness L of the coating $C_{dis}$ of a mixed system composed of block copolymers to take a value sufficiently far from an integral multiple of the lattice spacing d.

That is, if the film thickness L of the coating $C_{dis}$ of the mixed system composed of block copolymers takes an integral multiple of the lattice spacing d, the cylindrical phases B are oriented parallel to the substrate, as shown in FIG. 3B. On the other hand, if the film thickness L takes a value sufficiently far from an integral multiple of the lattice spacing d, the cylindrical phases B are oriented perpendicular to the substrate, as shown in FIG. 3A. It is to be noted that, according to types of the block copolymers constituting the continuous phase A and the cylindrical phases B, a thin film layer containing a component of the cylindrical phases B may be formed on an entire surface of the substrate. In this case, the thickness L in Expression 3 is calculated by subtracting a thickness of the thin film layer from that of the coating $C_{dis}$.

Two effects as follows contribute to the perpendicular orientation of the cylindrical phases B.

One of the two effects is that the cylindrical phases B in a hexagonally-packed periodic array pattern are stabilized, because of mixing two block copolymers. When the mixed system is used, a barycentric position of a unit lattice area, which is shown surrounded by dashed lines in FIG. 2A, is occupied by the block chain A2, which has a high degree of polymerization. In the meantime, an area surrounding the barycentric position is occupied by the block chain A1, which has a low degree of polymerization. This results in a uniform molecular density of the continuous phase A. The cylindrical phases B in the hexagonally-packed periodic array pattern are thus stabilized.

The other effect is a packing of the cylindrical phases B in the polymer thin film C. If the cylindrical phases B are packed in the film C having the film thickness L several times the lattice spacing d or less and are oriented parallel to the substrate 20, the film thickness L allows only some layers of the cylindrical phases B to be stacked in the film C, without creating a sufficiently extended hexagonal periodic array. On the other hand, if the cylindrical phases B are packed perpendicular to the substrate 20, the cylindrical phases B in a sufficiently extended hexagonal periodic array can be obtained, which is not limited to the film thickness L.

That is, when the mixed system of the block copolymers is used, the hexagonally-packed array pattern of the cylindrical phases B is stabilized. The pattern brings about the perpendicular orientation of the cylindrical phases B to the substrate 20, because the pattern tends to extend as far as possible in the film. The two effects described above contribute to the perpendicular orientation of the cylindrical phases B.

To sufficiently stabilize the hexagonal array pattern of the cylindrical phases B, it is required that the amounts and the molecular weights of the block copolymers to be mixed are adjusted to be within ranges as follows.

The amount of the block copolymer 11 may be not less than 65% and not more than 95% of a total amount of the block copolymers 11,12 to be mixed, on a weight fraction basis. The amount of the second block copolymer 12 may be not more than 35% and not less than 5%.

If the amount of the second block copolymer 12 is less than 5%, a total amount of the block chains A2 which reach the barycentric position of a unit lattice area as shown in FIG. 2A is too small to sufficiently stabilize the hexagonal array pattern. If the amount of the second block copolymer 12 is more than 35%, the total amount of the block chains A2 which are in positions other than the barycentric position is too large, to thereby disrupt the hexagonal array pattern.

Further, the first and second block copolymers 11,12 may be mixed such that a ratio of the molecular weight of the block chain A2 to that of the block chain A1 is not less than 1.0 and not more than 5.0.

If the ratio of the molecular weight of the block chain A2 to that of the block chain A1 is less than 1, the block chain A2 cannot reach the barycentric position of a unit lattice area as shown in FIG. 2A. If the ratio of the molecular weight of the second block copolymer 12 is more than 5, the first and second block copolymers after being mixed are not compatible but are separated in many cases.

[Patterned Substrate]

Next are described various methods to create a patterned substrate 21 using the microphase-separated structure of the polymer thin film C with reference to FIG. 4A to FIG. 4F. The polymer thin film C is composed of two types of polymeric phases, the continuous phase A and the cylindrical phases B. The patterned substrate referred to herein is a substrate having a patterned surface on which a pattern corresponding to a periodic array pattern having a microphase separation structure is created.

Figure 4A:
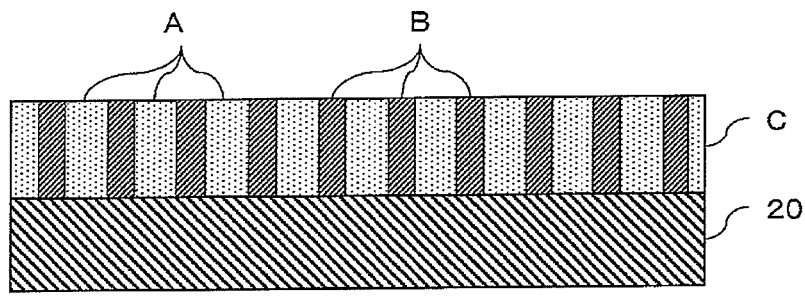
FIG. 4A to FIG. 4F are views showing steps of a method of manufacturing a patterned substrate according to an embodiment of the present invention.
Figure 4B:
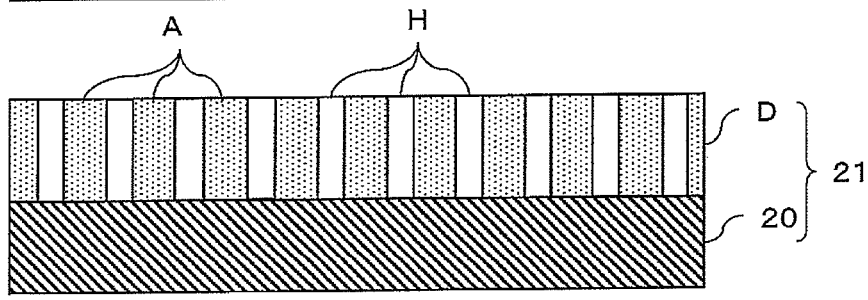

In FIG. 4A, the cylindrical phases B are selectively removed from a microphase-separated structure. In FIG. 4B, a porous thin film D is obtained on which a plurality of micropores H form a periodic array pattern.

Though not shown, the continuous phase A may be selectively removed from a microphase-separated structure. Then a polymer thin film is obtained on which a plurality of micropores H form a periodic array pattern. In both cases, the patterned substrate 21 can be created on which a plurality of micropores H or cylindrical structures form a periodic array pattern.

Though not described in detail herein, in FIG. 4B, the porous thin film D composed of any one of the polymeric phases remaining on the substrate 20 (in a case shown in FIG. 4B, the continuous phase A) is removed from the substrate 20. Then the porous thin film D itself can be used as the patterned substrate 21.

In FIG. 4B, other techniques to remove any one the polymeric phases (the continuous phase A or the cylindrical phases B constituting the polymer thin film C) are RIE (reactive ion etching) or any other etching making use of a difference in etching rate between the polymeric phases.

Another method of creating a patterned substrate is described with reference to FIG. 4C and FIG. 4D.

Figure 4C:
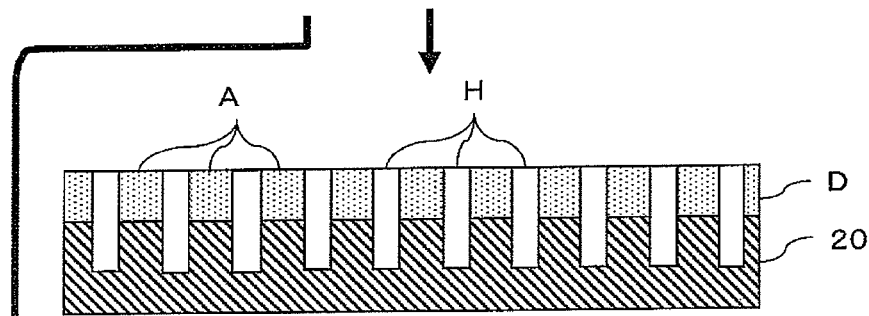
Figure 4D:
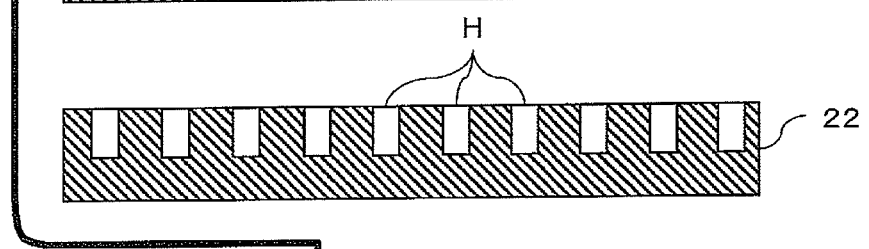

In FIG. 4C, the substrate 20 is RIE etched or plasma etched using one of the polymeric phases A,B remaining on the substrate 20 (the porous thin film D) (in FIG. 4B, the continuous phase A) as a mask. Thus a periodic array pattern of the polymer thin film D is transferred onto the substrate 20. In FIG. 2D, the porous thin film D remaining on the substrate 20 is removed using RIE or a solvent. Then the patterned substrate 22 is obtained on which the periodic array pattern constituted by the micropores H corresponding to the cylindrical phases B is formed.

Other method of creating a patterned substrate is described with reference to FIG. 4E and FIG. 4F.

Figure 4E:
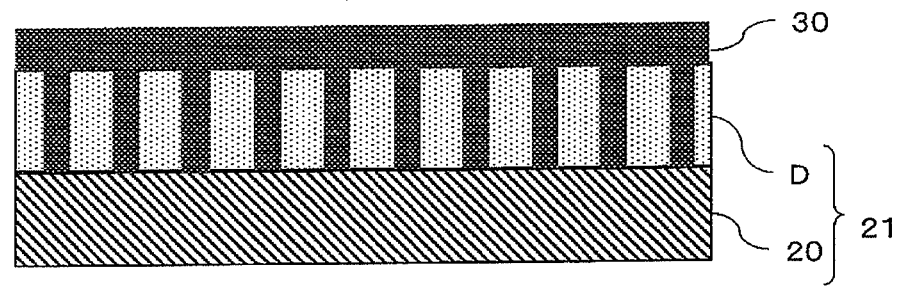
Figure 4F:
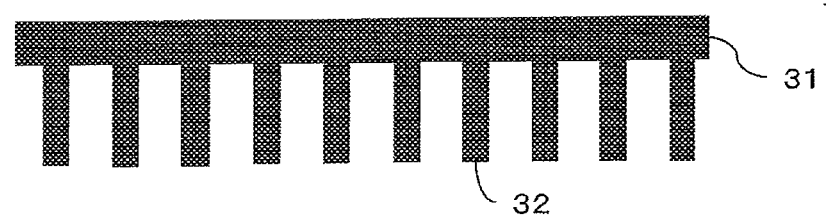

In FIG. 4E, one of the polymeric phases remaining on the substrate 20 (the porous thin film D) (in FIG. 4B, the continuous phase A) is closely brought in contact with a material to be transferred 30. A periodic array pattern having a microphase-separated structure of the porous thin film D is transferred onto the material to be transferred 30. In FIG. 4F, the material to be transferred 30 is separated from the patterned substrate 21, to thereby obtain a replica (a patterned substrate 31) on which a pattern corresponding to the periodic array pattern of the porous thin film D is transferred.

The material to be transferred 30 may be made of metal such as nickel, platinum and gold, an inorganic material such as glass and titania, or any other material suitable for an intended usage. If the material to be transferred 30 is made of metal, the material to be transferred 30 can be closely brought in contact with a patterned surface having a periodic array pattern on the patterned substrate 21, using sputtering, deposition, plating or a combination thereof.

If the material to be transferred 30 is made of an inorganic material, the material to be transferred 30 can be closely brought in contact with the surface using sputtering, CVD technique, sol-gel technique, or the like. The plating and the sol-gel technique may be suitably used. With the plating and the sol-gel technique, even a periodic array pattern on a several tens of nanometers scale can be transferred with precision, and cost can be reduced because of not using a vacuum process.

With the methods of creating a patterned substrate as described above, the patterned substrates 21,22,31 can be created on each of which a minute periodic array pattern having a large aspect ratio is formed.

If the polymer thin film C is formed on the substrate 20 having a flat and large surface, the polymer thin film C has in some cases a granular structure in which a large number of grain-like regions having different periodic array patterns of the cylindrical phases B are aggregated. In the grain-like regions, an orientation of the cylindrical phase B may have a point defect or a line defect. Therefore, the polymer thin film C described above may not be applied to a usage requiring a high-level periodic array pattern over a large area, such as processing of a magnetic recording pattern, which is to be described later.

Figure 5A:
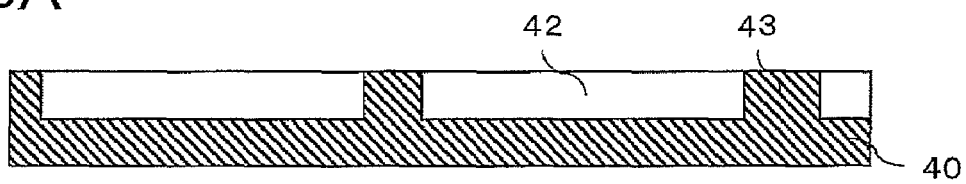
FIG. 5A to FIG. 5D are views showing steps of a method of manufacturing a patterned substrate according to another embodiment of the present invention.

FIG. 5A to FIG. 5D show steps of another method of manufacturing a patterned substrate 41. In FIG. 5A, a groove 42 and a guide 43 are formed on a surface of the substrate 40. This prevents a grain boundary, which disrupts a periodic array pattern of the cylindrical phases B in the continuous phase A, from being generated.

Figure 5B:
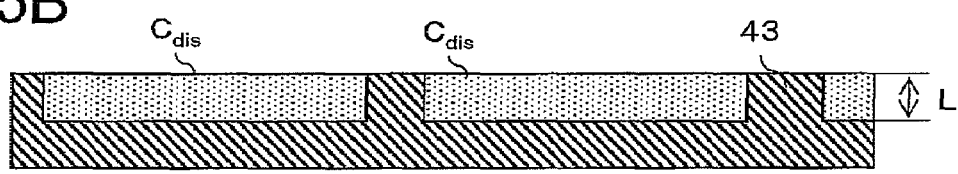

Further, if a height of the guide 43 is set according to the film thickness L which satisfies Expression 1, the coating $C_{dis}$ having a predetermined film thickness L can be easily formed in the groove 42 (FIG. 5B).

Figure 5C:
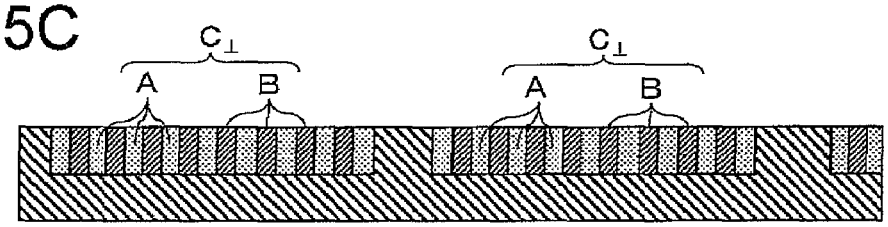

The groove 42 and the guide 43 may be formed on the substrate 40 using photolithography or the like. A microphase-separated structure is created inside the groove 42, a limited space surrounded by the guide 43. Thus the polymer thin film C can be formed on the substrate 40 in which generation of a defect, a grain-like region, and a grain boundary is prevented (FIG. 5C).

Figure 5D:
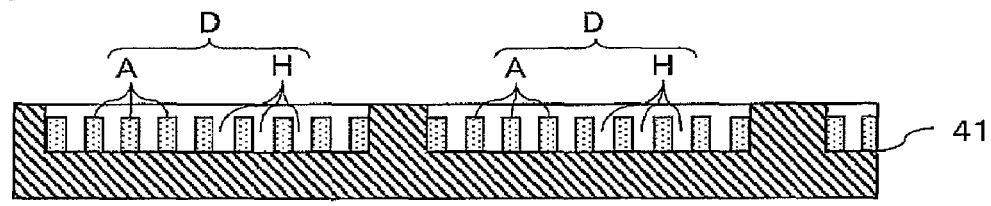

After that, a patterned surface having a periodic array pattern is formed on the substrate 40 using a method explained in FIG. 4 or the like, to thereby obtain the patterned substrate 41 (FIG. 5D).

FIG. 6A to FIG. 6F show steps of other method of manufacturing a patterned substrate 54. In the method, a periodic array pattern is formed on a surface of a substrate 50 using a guide 53.

Figure 6A:
FIG. 6A to FIG. 6F are views showing steps of a method of manufacturing a patterned substrate according to still another embodiment of the present invention.

The substrate 50 is a glass circular disk made of quartz. A $SiO_2$ layer 51 having a thickness of 50 nm is formed on the substrate 50 using CVD technique. An acrylate light curing resist film 52 having a thickness of 45 nm is further applied onto the $SiO_2$ layer 51 (FIG. 6A).

Figure 6B:
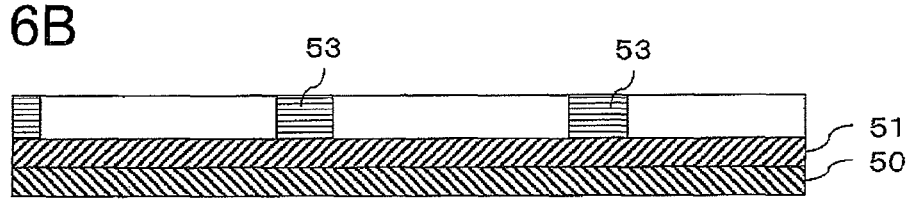
Figure 6C:
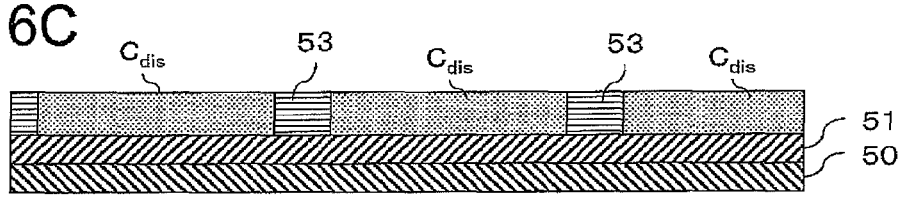
Figure 6D:
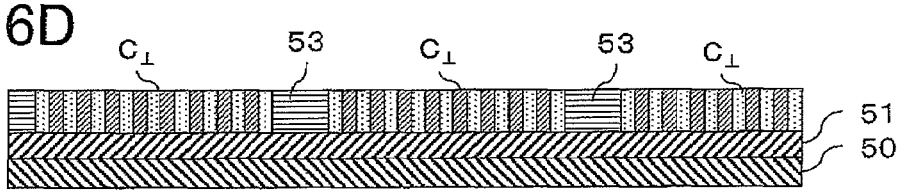

A plurality of concentric guides 53 are formed on the resist film 5 at a predetermined pitch using a known photolithography process (FIG. 6B). The coating $C_{dis}$ is formed in a groove-like space between adjacent guides 53,53 (FIG. 6C). A microphase separation is caused in the coating $C_{dis}$ using heat treatment (FIG. 6D). Any one of two resultant phases, cylindrical phases and a continuous phase is then selectively removed.

Figure 6E:
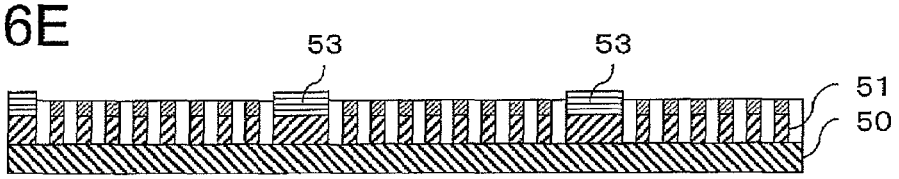
Figure 6F:

The $SiO_2$ layer 51 is etched using any one of the phase remaining on the $SiO_2$ layer 51 as a mask (FIG. 6E). Finally, the phase remaining on the $SiO_2$ layer 51 and the resist film 52 are removed using oxygen ashing. With the steps described above, the patterned substrate 54 is obtained on which a periodic array pattern is formed (FIG. 6F).

The patterned substrates 21,22,31,54 obtained in the methods described above each have a minute periodic array pattern and a large aspect ratio, and can be applied to various usages.

For example, a surface of such a patterned substrate is closely brought in contact with materials to be transferred one after another, using a nanoimprint technique or the like, to thereby mass-produce replicas each having a periodic array pattern of the patterned substrate.

Next are described methods of transferring a minute periodic array pattern onto a material to be transferred using a nanoimprint technique.

One method is that a periodic array pattern on a patterned substrate is directly imprinted onto a material to be transferred (thermal imprint method). The thermal imprint is suitable, if the material to be transferred is good for direct imprinting. For example, if the material to be transferred is made of a thermoplastic resin such as a polystyrene, the method is conducted as follows. The material to be transferred is heated to a glass transition temperature or higher of the thermoplastic resin. The material to be transferred is closely come in contact with the patterned substrate. The closely contacted material to be transferred and the patterned substrate are cooled to the glass transition temperature or lower. After that, the patterned substrate is separated from the material to be transferred to obtain a replica of the patterned substrate.

Another method is that a periodic array pattern on a patterned substrate made of a light transmittable material such as a glass, is imprinted onto a material to be transferred (photo imprint). In the photo imprint, the material to be transferred made of a light curing resin is closely come in contact with a patterned substrate, and the light curing resin is cured by the light transmitted through the patterned substrate. After that, the patterned substrate is separated from the material to be transferred to obtain a replica of the patterned substrate.

Other method using the photo imprint uses a glass, or other light transmittable substrate as a material to be transferred. A light curing resin is applied between the material to be transferred and a patterned substrate without creating any gap therebetween. Light is irradiated to cure the light curing resin. The patterned substrate is separated from the material to be transferred on which the light curing resin having a pattern corresponding to the periodic array pattern of the patterned substrate is provided. The patterned substrate is plasma-etched or ion beam-etched, using the pattern of the light curing resin as a mask, to obtain a replica of the patterned substrate.

[Patterned Medium for Magnetic Recording]

Prior to a description of a patterned medium for magnetic recording in the embodiment, a medium for magnetic recording is explained below. A medium for magnetic recording is constantly required to have higher recording density. Thus, a dot, a base unit for recording data, on a medium for magnetic recording has been made further minute. A distance between adjacent dots also becomes smaller, resulting in dots disposed in an extremely high density.

For example, to obtain a recording medium having a recording density of 1 terabit per square inch, a pitch of dots in a patterned array is required to be about 25 nanometers. There is a possibility that, when a single dot among highly densified dots is magnetized for an ON/OFF operation, another dot adjacent thereto may also be inconveniently magnetized.

To avoid an influence of magnetic leakage from an adjacent dot, there is a method of creating a periodic array pattern on a medium for magnetic recording, in which dots on the medium are sterically divided.

A patterned medium for magnetic recording in the embodiment described herein, uses a periodic array pattern on a patterned substrate manufactured according to the present invention, and forms thereon a pattern of dots of a medium for magnetic recording as described above.

A substrate for such a patterned medium for magnetic recording is made of glass or aluminum. The substrate is subjected to the steps shown in FIG. 6A to FIG. 6F to obtain the patterned substrate 54. A magnetic recording layer is formed on the patterned substrate 54 using sputtering or the like, to thereby obtain a medium for magnetic recording.

Another method to obtain a patterned medium for magnetic recording is that the patterned substrate 54 shown in FIG. 6F is processed as needed using a nanoimprint technique such as photo imprint and heat imprint.

More specifically, a thermoplastic resin or a light curing resin is applied to a substrate for the patterned medium for magnetic recording not yet having any periodic array pattern. A periodic array pattern of the patterned substrate 54 is transferred onto the applied resin, which in turn is used as a mask in plasma-etching or ion beam-etching the substrate. The method is advantageous in cost and productivity.

In the embodiment, the polymer thin film C has been mainly described above which is used for manufacturing the patterned substrates 21,22,31 each having a periodic array pattern on its surface. However, a usage of the polymer thin film C is not limited to this. The polymer thin film C may be used for manufacturing a porous thin film D, which may be used as a filter.

Example 1

In Example 1, the polymer thin film C having a structure in which the cylindrical phases B made of a polymethylmethacrylate (PMMA) were arrayed in the continuous phase A made of a polystyrene (PS), was formed on the substrate 20 (see FIG. 1A and FIG. 1B).

The first and second block copolymers 11,12 (see FIG. 2B as needed) constituted a mixed system composed of two types of diblock copolymers (PS-b-PMMA). The two PS-b-PM- MAs were both composed of PS and PMMA as monomers having different molecular weights.

More specifically, a first PS-b-PMMA had number average molecular weights Mn of the PS block chains and the PMMA block chains of 35,500 and 12,200, respectively. A molecular weight distribution of the entire first PS-b-PMMA Mw/Mn was 1.04.

A second PS-b-PMMA had the number average molecular weights Mn of the PS block chains and the PMMA block chains of 46,000 and 21,000, respectively. The molecular weight distribution Mw/Mn of the entire second PS-b-PMMA was 1.09.

The first PS-b-PMMA and the second PS-b-PMMA were mixed in a weight ratio of 4:1, to obtain a polymer mixture having a PMMA volume fraction ϕPMMA of 0.27 of a total volume of the polymer mixture.

The polymer mixture had a ratio of PS-b-PMMA, as the primary component, of 80% of total. With regard to the PS block chains constituting the continuous phase A, the polymer mixture had a ratio of the number average molecular weight Mn of the PS block chains of the first PS-b-PMMA to the number average molecular weight Mn of the PS block chains of the second PS-b-PMMA, as the secondary component, of 1.3.

The polymer mixture was then dissolved in a toluene solvent, to prepare a polymer mixture solution having a concentration of 1.0 to 3.0% by weight. The polymer mixture solution was dropped on a surface of the silicon substrate 20 (see FIG. 3 as needed), and was subjected to spin coating. The solvent was vaporized to form the coating $C_{dis}$ on the substrate 20. The concentration of the polymer mixture solution and a rotation speed of the spin coating were varied to obtain five types of coatings $C_{dis}$ having the film thicknesses L of 18 nm, 29 nm, 39 nm, 52 nm and 62 nm (see FIG. 7A, column 1, as needed). The film thicknesses L correspond to samples shown in FIG. 3A(i), FIG. 3B(i), FIG. 3A(i9), FIG. 3B(ii), and FIG. 3A(iii), respectively.

A surface of each coating $C_{dis}$ formed on the substrate 20 was observed with an atomic force microscope. It was observed that the surface of each coating $C_{dis}$ was uniform, that is, the surface of the substrate 20 was uniformly coated. Note that the aforementioned film thicknesses L were measured in such a way that a portion of the coating $C_{dis}$ was cut away from the substrate 20 with a sharp blade, and a step between the substrate 20 with and without the coating $C_{dis}$ was scanned. A height of the step corresponds to the film thicknesses L.

The substrate 20 used herein was a Si wafer. Prior to testing, a surface of the substrate 20 was well cleaned by soaking in a mixed solution of a concentrated sulfuric acid and a hydrogen peroxide water in a ratio of 3:1 (a piranha solution) at a temperature of 90 degrees Celsius for 10 minutes.

The substrate 20 with the coating $C_{dis}$ formed thereon was heat treated under a vacuum atmosphere at a temperature of 170 degrees Celsius for 24 hours to cause a microphase-separated structure in the polymer thin film C (see FIG. 3A(iv), (v), (vi), and FIG. 3B(iv), (v)). The obtained structure in the polymer thin film C was observed with an optical microscope (hereinafter referred to as an OM) and an atomic force microscope (hereinafter referred to as an AFM).

It was observed with the OM whether the heat treatment caused the polymer thin film C to have a region having macroscopically different film thicknesses. The OM observation demonstrated that, as shown in FIG. 7A, column 2, all samples having different film thicknesses had uniform color tones without any contrast.

As a result, it was revealed that the polymer thin film C prepared by using the polymer mixture maintained a uniform film thickness, even after a microphase separation was caused.

A portion of the coating $C_{dis}$ was cut away from the substrate 20 with a sharp blade, after the microphase separation was caused. The film thickness L was measured with the AFM by scanning a step between the substrate 20 with and without the coating $C_{dis}$. The AMF observation results are shown in FIG. 7A, column 3. It was revealed that the obtained film thicknesses L were substantially same as the initial film thicknesses L measured prior to the heat treatment (see FIG. 7A, column 1).

Convexo-concave pattern derived from the microphase-separated structure in the polymer thin film C were observed with the AFM. The convexo-concave pattern were prepared by irradiating ultraviolet rays on the surface of the polymer thin film C for 6 minutes so as to conduct ashing of the surface for removing a PMMA phase by about 5 nm in thickness. The observation results are shown in FIG. 7A, column 5, and representative AFM observation images are shown in FIG. 8A to FIG. 8C.

Figure 8A:
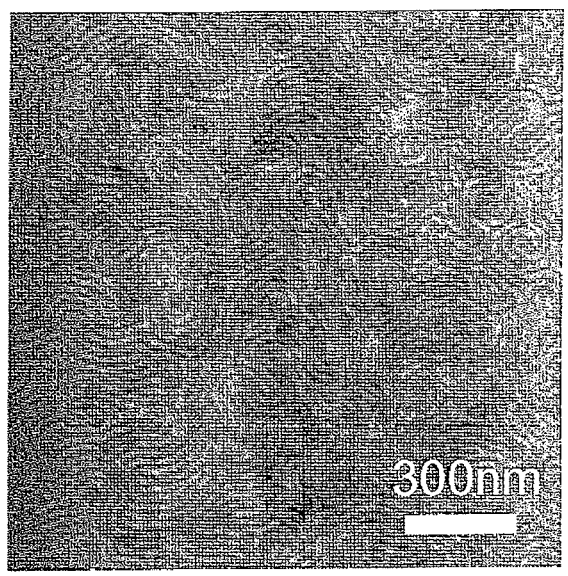
FIG. 8A and FIG. 8C are images each showing a polymer thin film taken by an AFM, in which the film thickness L does not satisfy a relation represented by Expression 1, in a comparative example.

FIG. 8A is an AFM observation image when an initial film thickness was 29 nm, in which concave columns each having a diameter of about 15 nm and laid in the coating $C_{dis}$ were dominantly observed. It was revealed that the concave columns were formed when the PMMA phase was etched with ultraviolet rays, and the PMMA cylindrical phase was laid in the PS continuous phase. The AFM observation image corresponds to a sample shown in FIG. 3B(iv).

Figure 8B:
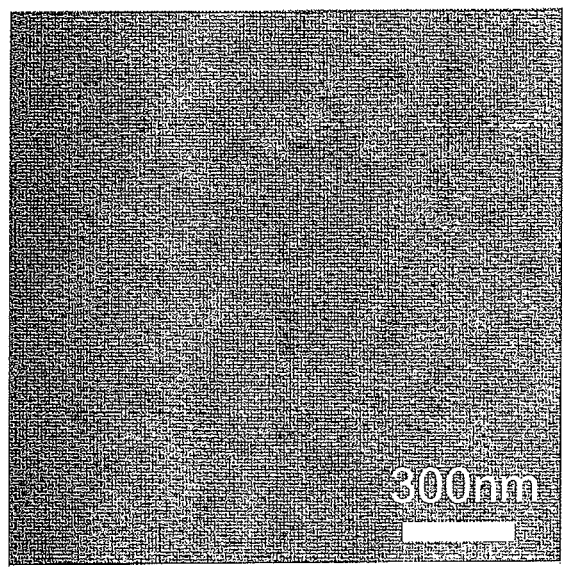
FIG. 8B is an image showing a polymer thin film taken by a atomic force microscope (AFM), in which the film thickness L of the coating $C_{dis}$ of a mixed system composed of two block copolymers satisfies a relation represented by Expression 1, in the first example.

FIG. 8B is an AFM observation image when an initial film thickness was 39 nm, in which periodically arrayed concave circles were dominantly observed. The concave circles were arrayed in a substantially hexagonal close-packed structure, which had a center distance of about 29 nm. It was revealed that the concave circles were formed when the PMMA phase was etched with ultraviolet rays, and the PMMA cylindrical phases were positioned perpendicular to the coating $C_{dis}$ in the PS continuous phase. The AFM observation image corresponds to a sample shown in FIG. 3A(v).

Figure 8C:
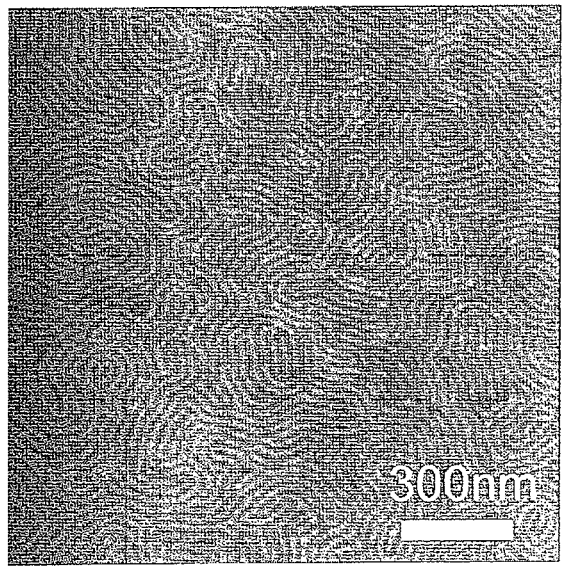

FIG. 8C is an AFM observation image when an initial film thickness was 52 nm, in which concave columns each having a diameter of about 15 nm and laid in the coating $C_{dis}$ were dominantly observed. It was revealed that the concave columns were formed when the PMMA phase was etched with ultraviolet rays, and the PMMA cylindrical phases were laid in the PS continuous phase. The AFM observation image corresponds to a sample shown in FIG. 3B(v).

An average center distance r of the cylindrical phases B in FIG. 8A to FIG. 8C was measured with imaging analysis. Assuming that there was a hexagonal lattice of the respective cylindrical phases B, the lattice spacings d were calculated using Expression 2. The resultant lattice spacings d were all 25 nm.

Ratios of the film thickness L to the lattice spacing d (L/d) after the heat treatment are shown in FIG. 7A, column 4. The AFM observations demonstrated that, if the ratios L/d were 0.7, 1.5 and 2.5, that is, if the film thickness L of a sample satisfies Expression 3, the cylindrical phases B were uniformly oriented perpendicular to the substrate 20.

On the other hand, the AFM observations also demonstrated that, if the ratios L/d were 1.1 and 2.0, that is, if the film thickness L of a sample did not satisfy Expression 3, the cylindrical phases B were provided uniformly over and oriented parallel to the substrate 20.

FIG. 7B shows observation results of the microphase-separated structure obtained by using a mixed system of the PS-b-

PMMA. The mixed system was prepared such that the cylindrical phases B composed of PS were oriented perpendicular to a surface of the coating $C_{dis}$ in the continuous phase A composed of PMMA.

A method of forming the polymer thin film C and details of testing were same as those explained above with reference to FIG. 7A, and description thereof is omitted herefrom.

A first PS-b-PMMA used herein had the number average molecular weights Mn of the PS block chains and the PMMA block chains of 20,200 and 50,500, respectively. The molecular weight distribution of the first PS-b-PMMA Mw/Mn was 1.07. A second PS-b-PMMA used herein had the number average molecular weights Mn of the PS block chain and the PMMA block chain of 26,000 and 68,000, respectively. The molecular weight distribution Mw/Mn of the second PS-b-PMMA was 1.18. The first PS-b-PMMA and the second PS-b-PMMA were mixed in a weight ratio of 4:1, to obtain a polymer mixture having a PS volume fraction φPS of 0.28 of a total volume of the polymer mixture.

The polymer mixture had a ratio of the first PS-b-PMMA, the primary component, of 80% of total. With regard to the PS block chains constituting the continuous phase A, the polymer mixture had a ratio of the number average molecular weight Mn of the PS block chains of the first PS-b-PMMA to the number average molecular weight Mn of the PS block chains of the second PS-b-PMMA, the secondary component, was 1.3.

Lattice spacings d of the cylindrical phases B in the mixed system were all 30 nm.

Observations shown in FIG. 6B demonstrated that, similarly to FIG. 6A, if the ratios L/d were 0.7, 1.5 and 2.5, that is, if the film thickness L of a sample satisfied Expression 1, the cylindrical phases B were provided uniformly over and oriented perpendicular to the substrate 20.

Comparative Example

Example 1 described that the mixed system in which the first PS-b-PMMA and the second PS-b-PMMA were mixed in a weight ratio of 4:1, and the cylindrical phases B were oriented perpendicular to the surface of the substrate 20 by adjusting values of the film thicknesses L of the coating $C_{dis}$ to satisfy Expression 1 or Expression 3.

Based on this, comparative Example was conducted to examine an effect of mixing two types of block copolymers. The volume fraction of PMMA was 0.25.

Only PS-b-PMMA was used as a component of the coating $C_{dis}$, which is hereinafter referred to as a single system. The coatings $C_{dis}$ of the single system having the initial film thicknesses L of 25 nm, 30 nm, and 41 nm were used (see FIG. 7C, column 1). Note that a method of forming the coating $C_{dis}$ and details of testing were same as those explained in Example 1, and description thereof is omitted herefrom.

The coatings $C_{dis}$ of the single system having the film thicknesses L of 25 nm, 30 nm, and 41 nm correspond to samples shown in FIG. 3B(i), FIG. 3C(ii), and FIG. 3B(ii), respectively.

The substrate 20 with the coating $C_{dis}$ of the single system formed thereon was heat treated as in Example 1 to cause a microphase-separated structure in the polymer thin film C. The obtained structure in the polymer thin film C was observed with an OM and an AFM.

OM observations of the coatings $C_{dis}$ having the initial film thicknesses L of 25 nm and 41 nm revealed that, as shown in FIG. 7C, column 2, the obtained polymer thin film C had uniform color tones, demonstrating uniform film thicknesses thereof. After that, the surfaces of the polymer thin films C were UV-etched. A height of a step between different microdomains in the polymer thin film C was scanned with the AMF. Obtained results demonstrated that the both polymer thin films C having the initial film thicknesses L of 25 nm and 41 nm had the cylindrical phases B oriented perpendicular to the substrate 20, as shown in observation images of FIG. 9A and FIG. 9B, respectively.

Figure 9A:
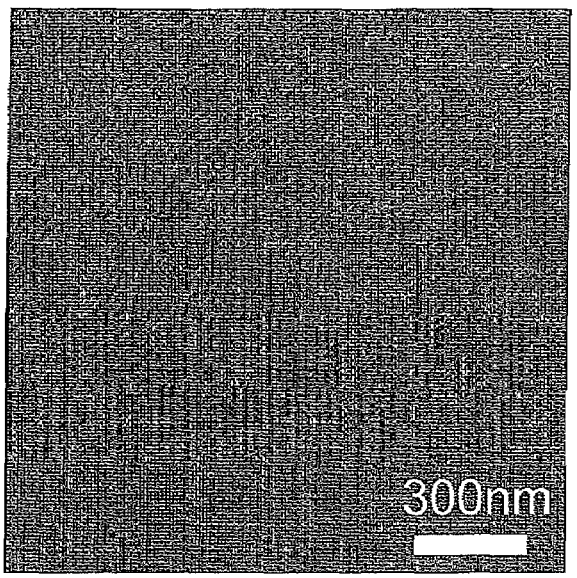
FIG. 9A, FIG. 9B, and FIG. 9C are images each showing a polymer thin film taken by an AFM, in which a microphase separation is caused in the coating $C_{dis}$ of a single system composed of a block copolymer, in a comparative example.
Figure 9B:
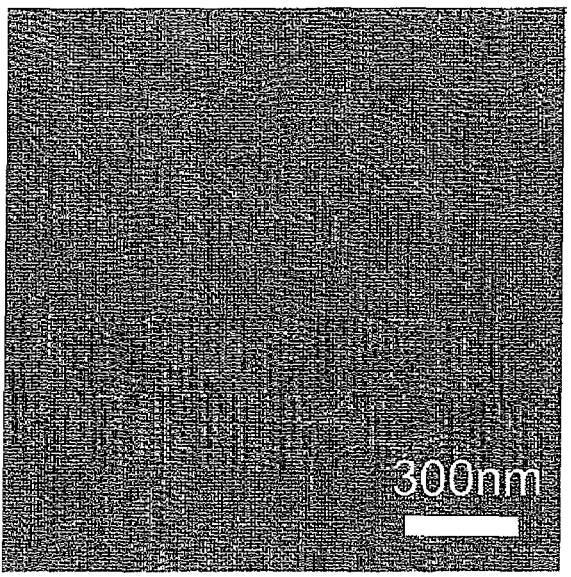

The average center distances r of the cylindrical phases B in FIG. 9A and FIG. 9B were measured with imaging analysis. The lattice spacings d of assumed hexagonal lattices of the respective cylindrical phases B were all 20 nm.

Figure 9C:
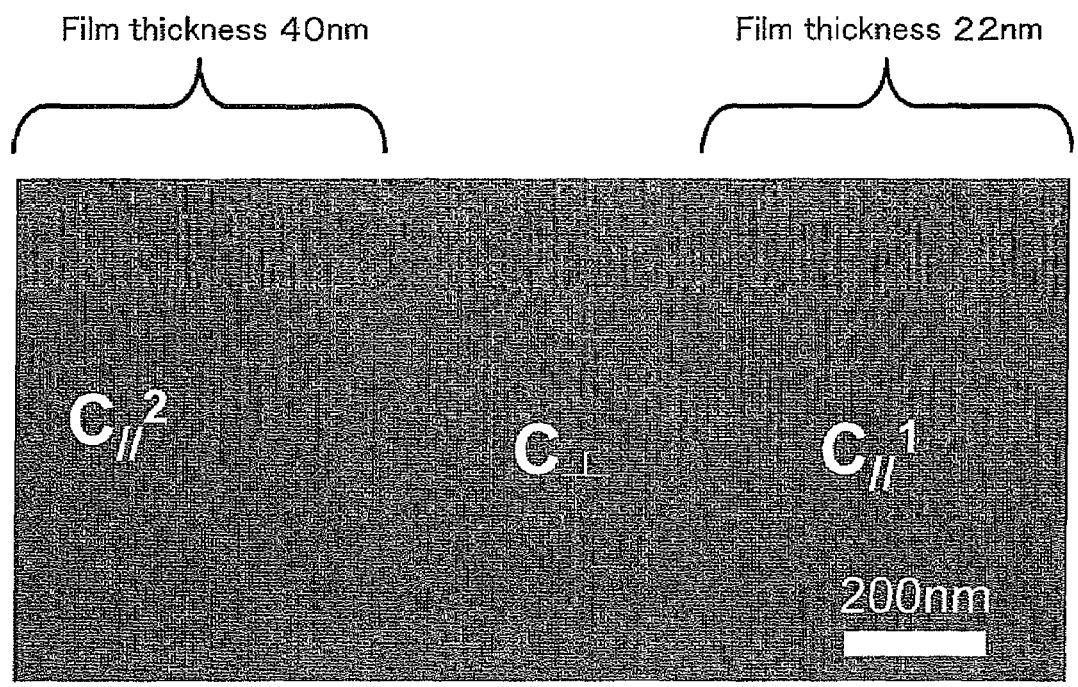

OM observations of the polymer thin film C having the initial film thickness L of 30 nm revealed that, as shown in FIG. 7C, column 2 and FIG. 9C, the polymer thin film C had a sea-island structure with regions having different color tones. This suggested that the polymer thin film C was macroscopically divided into regions having thicker and thinner film thicknesses.

A distribution of the different film thicknesses was measured with the AFM. It was demonstrated that the polymer thin film C, which had initially had the film thickness of 30 nm prior to the heat treatment, had the film thickness L of 40 nm in some regions and 22 nm in others.

The thicker 40 nm regions, the thinner 22 nm regions, and an interface therebetween were observed with the AFM in a contrast mode. The observation revealed that the cylindrical phases B were oriented parallel to the substrate 20 in the former two regions, and perpendicular thereto in a portion of the interface (see FIG. 9C).

The resultant film thicknesses L and ratios of the film thicknesses L to the lattice spacings d were shown in FIG. 7C, columns 3 and 4. If the ratios were 1.2 and 2.1, the cylindrical phases B were oriented parallel to and laid on the substrate 20. As a result, it was revealed that the heat treatment caused the coating $C_{dis}$ having the initial film thickness L of 30 nm to be macroscopically divided into two regions having the ratios of the film thicknesses L to the lattice spacings d of 1.1 and 2.0.

Consequently, if a single system of the block copolymers was used, it was not possible to obtain the cylindrical phases B uniformly provided over and oriented perpendicular to the substrate, as shown in FIG. 8B.

Example 2

Example 2 was conducted to examine an effect of a mixed ratio volume (fraction) of the first PS-b-PMMA and the second PS-b-PMMA, in forming, on the substrate 20, the polymer thin film C in which the cylindrical phases B composed of PMMA were periodically arrayed in the continuous phase A composed of PS.

Example 2 used a mixed system of two block copolymers same as that in Example 1. That is, the first PS-b-PMMA had the number average molecular weights Mn of the PS block chains and the PMMA block chains of 35,500 and 12,200, respectively. The molecular weight distribution Mw/Mn of the first PS-b-PMMA was 1.04. The second PS-b-PMMA had the number average molecular weights Mn of the PS block chains and the PMMA block chains of 46,000 and 21,000, respectively. The molecular weight distribution Mw/Mn of the second PS-b-PMMA was 1.09.

The mixed system had a ratio of the number average molecular weight Mn of the PS block chains of the first PS-b-PMMA as the primary component, to the number average molecular weight Mn of the PS block chains of the second PS-b-PMMA as the secondary component, of 1.3 (see FIG. 10A, column 2).

The first PS-b-PMMA and the second PS-b-PMMA were mixed in different ratios. A plurality of polymer mixtures having the first PS-b-PMMA and the second PS-b-PMMA mixed in the different ratios were obtained. That is, the polymer mixtures had ratios of the first PS-b-PMMA as the primary component to total of 60% to 95% (see FIG. 10A, column 1). A ratio of the second PS-b-PMMA as the secondary component to total and a volume fraction φPMMA of PMMA constituting the cylindrical phases B to total are shown in FIG. 10A, column 3.

The mixed system was applied to a surface of each of silicon substrates having different thicknesses using a method same as that in Example 1. The substrates were annealed to cause microphase-separated structures. Thus, the obtained polymer thin films C were observed using a technique same as that in Example 1. Orientation of the cylindrical microdomain and the lattice spacing d thereof were measured. The film thicknesses L of the polymer thin films C after the heat treatment were also measured.

Observations of orientation of the cylindrical phases B are shown in FIG. 10A, column 7, in which n=2 in Expression 1. It was revealed that, when the ratios of the first PS-b-PMMA to the total were 70%, 80%, and 90%, the cylindrical phases B were uniformly provided over and oriented perpendicular the substrate. On the other hand, when the ratios of the first PS-b-PMMA to the total were 60% and 95%, the cylindrical phases B were oriented perpendicular to the substrate in some regions and parallel thereto in others.

Consequently, it was revealed that, in a sample of L=1.5 d, in order to obtain a structure in which the cylindrical phases B are uniformly provided over and oriented perpendicular to the substrate, it is required that the ratio of the first PS-b-PMMA as the primary component to the total is not less than 65% and not more than 90%.

Example 3

Example 3 was conducted to examine an effect of a ratio of molecular weights of the first PS-b-PMMA and the second PS-b-PMMA, in forming, on the substrate 20, the polymer thin film C in which the cylindrical phases B composed of PMMA were periodically arrayed in the continuous phase A composed of PS.

Example 3 also used a mixed system of two block copolymers. The first PS-b-PMMA as the primary component is same as that used in Example 1, and had number average molecular weights Mn of the PS block chains and the PMMA block chains of 35,500 and 12,200, respectively. The molecular weight distribution Mw/Mn of the first PS-b-PMMA was 1.04. A plurality of the second PS-b-PMMAs were used as the secondary component used having following various number average molecular weights Mn of the PS block chain and the PMMA block chain, as indicated in parentheses: PS(260,000)-b-PMMA(63,500), PS(140,000)-b-PMMA(60,000), PS(52,000)-b-PMMA(52,000), PS(46,000)-b-PMMA(21,200), and PS(12,800)-b-PMMA(12,900). The molecular weight distributions Mw/Mn thereof were 1.07, 1.16, 1.10, 1.09, and 1.05, respectively.

The mixed system was prepared to have a ratio of the first PS-b-PMMA as the primary component to the total of 80% to 90%, as shown in FIG. 10B. FIG. 10B, column 2 shows a ratio of the number average molecular weight Mn of the PS block chain of the second PS-b-PMMA to that of the first PS-b-PMMA in the polymer mixture (hereinafter referred to as PS block chain molecular weight ratio). FIG. 10B, column 3 shows a volume fraction φPMMA of PMMA constituting the cylindrical phases B to a total volume.

The mixed system was applied to a surface of each of silicon substrates having different thicknesses using a method same as that in Example 1. The substrates were annealed to cause microphase-separated structures. The obtained polymer thin films C were observed using a technique same as that in Example 1. Orientation of the cylindrical phases B and the lattice spacing d thereof were measured. The film thicknesses L of the polymer thin films C after the heat treatment were also measured.

Observations of orientation of the cylindrical phases B are shown in FIG. 10A, column 7, in which n=2 in Expression 1. It was revealed that, when the PS block chain molecular weight ratios were 4.5, 1,5, and 1.3, the cylindrical phases B were uniformly provided over and oriented perpendicular to the substrate.

On the other hand, when the PS block chain molecular weight ratio was 0.4, the cylindrical phases B were oriented perpendicular to the substrate 20 in some regions and parallel thereto in others. When the PS block chain molecular weight ratio was 7.3, the first PS-b-PMMA and the second PS-b-PMMA would not uniformly mixed but were macroscopically phase-separated, without forming a uniform film.

Consequently, it was revealed that, in a sample of L=1.5 d, in order to obtain a structure in which the cylindrical phases B were uniformly provided over and oriented perpendicular to the substrate, it is required that the PS block chain molecular weight ratio is not less than 1.0 and not more than 5.0.

Example 4

Example 4 describes a method of manufacturing a patterned substrate with reference to, for example, FIG. 4A and FIG. 4B, in which the cylindrical phases B in the polymer thin film C were degraded and removed, to obtain the porous thin film D on the substrate 20.

In FIG. 4A, the polymer thin film C was prepared, which had an initial film thickness of 39 nm with the observation results shown in FIG. 7A and a structure in which the cylindrical phases B composed of PMMA were oriented perpendicular to the surface of the film C (in a pass-through direction with respect to the film C). In FIG. 4B, the cylindrical phases B were removed using RIE to obtain the porous thin film D. Pressure of an oxygen gas was 1 Pa, and an output of the gas was 20 W. Etching time was for 90 seconds.

The surface of the obtained porous thin film D was observed using a scanning electron microscope.

The observation demonstrated that the porous thin film D had columnar micropores H which were oriented in the pass-through direction of the film D. A diameter of each of the micropores H was about 15 nm. The micropores H were arrayed to have a substantially hexagonal close-packed structure. The lattice spacing d of each hexagonal lattice constituted by the micropores H was about 28 mm. A portion of the porous thin film D was cut away in a thickness direction thereof from the substrate 20 using a sharp blade. A step between the substrate 20 with and without the porous thin film D was scanned with the AMF to obtain the film thickness L of the film D, which was 40 nm.

An aspect ratio of the obtained micropores H was as large as 2.6, which would not be obtained with a spherical microdomain. It is to be noted that the film thickness of the polymer thin film C was reduced from 45 nm to 40 nm before and after RIE, because not only the cylindrical phase B but also the continuous phase A might be slightly etched.

In FIG. 4A, another polymer thin film C was prepared, which had an initial film thickness of 45 nm with the observation results shown in FIG. 7B and a structure in which the cylindrical phases B composed of PMMA were oriented perpendicular to the surface of the film C (in a pass-through direction with respect to the film C). In FIG. 4B, the cylindrical phases B were removed using RIE to obtain the porous thin film D under same conditions as described above.

The surface of the obtained porous thin film D was observed using a scanning electron microscope. The observation demonstrated that the porous thin film D had columnar micropores H which were oriented in the pass-through direction of the film D. A diameter of each of the micropores H was about 20 nm. The micropores H were arrayed to have a substantially hexagonal close-packed structure.

The invention claimed is:

1. A method of manufacturing a polymer thin film in which cylindrical phases are distributed in a continuous phase, and the cylindrical phases are provided in a substantially periodic array pattern and oriented in a pass-through-direction of the polymer thin film, comprising the steps of:

applying a solution on a surface of a substrate, the solution containing a solvent and at least a first block copolymer comprising a block chain A1, as a component of the continuous phase, composed of polymerized monomers a1, and a block chain B1, as a component of the cylindrical phases, composed of polymerized monomers b1, and, a second block copolymer comprising at least a block chain A2, as a component of the continuous phase, composed of polymerized monomers a2, and a block chain B2, as a component of the cylindrical phases, composed of polymerized monomers b2, the second block copolymer having a degree of polymerization different from that of the first block copolymer, a weight fraction of the first block copolymer is not less than 65% and not more than 95% of a total weight of the first and second block copolymers, and a ratio of a molecular weight of the block chain A1 to a molecular weight of the block chain A2 in the second block copolymer is more than 1.0 and not more than 5.0;

forming a coating by evaporating the solvent from the solution, the coating formed on the surface of the substrate having a film thickness L thereof that satisfies an expression as follows:

$$\frac{\sqrt{3}}{2} r \times \left\{ \frac{1}{2}(2n-1) - 0.35 \right\} \leq L \leq \frac{\sqrt{3}}{2} r \times \left\{ \frac{1}{2}(2n-1) + 0.35 \right\} (n = 1,2,3)$$

(herein, r is an average center distance between adjacent cylindrical phases); and heat treating the coating and causing microphase separation of the coating into the continuous phase and the cylindrical phases.

2. The method of manufacturing the polymer thin film of claim 1, further comprising a step of selectively removing the continuous phase in the polymer thin film of the substrate to form a first patterned surface on a first patterned substrate.

3. The method of manufacturing the polymer thin film of claim 2, further comprising a step of processing a surface of a second substrate in a position corresponding to the selectively removed continuous phase in the polymer thin film of the first patterned substrate, to obtain a second patterned substrate on which a second patterned surface, corresponding to the first patterned surface of the first patterned substrate, is transferred.

4. The method of manufacturing a polymer thin film of claim 2, further comprising the steps of:

contacting a material to be transferred closely with the first patterned substrate, to obtain a third patterned substrate having a third patterned surface on which the first patterned surface on the first patterned substrate is transferred; and separating the third patterned substrate from the first patterned substrate.

5. The method of manufacturing a polymer thin film of claim 3, further comprising the steps of:

contacting a material to be transferred closely with the second patterned substrate, to obtain a third patterned substrate having a third patterned surface on which the second patterned surface on the second patterned substrate is transferred; and separating the third patterned substrate from the second patterned substrate.

6. The method of manufacturing the polymer thin film of claim 1, further comprising a step of selectively removing the cylindrical phases in the polymer thin film of the substrate to form a first patterned surface on a first patterned substrate.

7. The method of manufacturing the polymer thin film of claim 6, further comprising a step of processing a surface of a second substrate in a position corresponding to the selectively removed cylindrical phases in the polymer thin film of the first patterned substrate, to obtain a second patterned substrate on which a second patterned surface, corresponding to the first patterned surface of the first patterned substrate, is transferred.

8. The method of manufacturing a polymer thin film of claim 6, further comprising the steps of:

contacting a material to be transferred closely with the first patterned substrate, to obtain a third patterned substrate having a third patterned surface on which the first patterned surface on the first patterned substrate is transferred; and separating the third patterned substrate from the first patterned substrate.

9. The method of manufacturing a polymer thin film of claim 7, further comprising the steps of:

contacting a material to be transferred closely with the second patterned substrate, to obtain a third patterned substrate having a third patterned surface on which the second patterned surface on the second patterned substrate is transferred; and separating the third patterned substrate from the second patterned substrate.

* * * * *